United States Patent [19]

Izukawa

[11] Patent Number: 5,313,236
[45] Date of Patent: May 17, 1994

[54] DEMODULATION PROCESSING CIRCUIT WITH TIME INTERVAL COUNTING FEATURE

[75] Inventor: Kazuhiro Izukawa, Misato, Japan

[73] Assignee: Canon Kabushiki Kaisha, Tokyo, Japan

[21] Appl. No.: 983,404

[22] Filed: Nov. 30, 1992

[30] Foreign Application Priority Data

Nov. 28, 1991 [JP] Japan ................. 3-337871
May 21, 1992 [JP] Japan ................. 4-153080

[51] Int. Cl.$^5$ ............. G03B 17/24; H03K 7/06; G11B 20/10; H03D 7/00
[52] U.S. Cl. ................. 354/106; 329/313; 360/29; 360/40; 375/23
[58] Field of Search ............. 354/105, 106, 173.1, 354/173.11; 360/40, 29; 329/313, 312; 375/23, 110

[56] References Cited

U.S. PATENT DOCUMENTS

| | | | |
|---|---|---|---|
| 4,964,139 | 10/1990 | Wash et al. | 375/23 |
| 5,025,328 | 6/1991 | Silva | 375/110 |
| 5,115,356 | 5/1992 | Silva | 360/40 |
| 5,184,161 | 2/1993 | Egawa | 354/105 |

Primary Examiner—W. B. Perkey
Attorney, Agent, or Firm—Fitzpatrick, Cella, Harper & Scinto

[57] ABSTRACT

In a demodulation circuit for demodulating a pulse position modulation (PPM) signal, and a camera having the demodulation circuit, a change in PPM signal is counted by an up/down counter which is switched between count-up and count-down modes every time the PPM signal changes. When a carry signal is output from the counter, the carry signal is latched, and the PPM signal is demodulated into binary data on the basis of the presence/absence of the carry signal in the count-up mode and the carry signal in the count-down mode.

6 Claims, 32 Drawing Sheets

FIG. 34
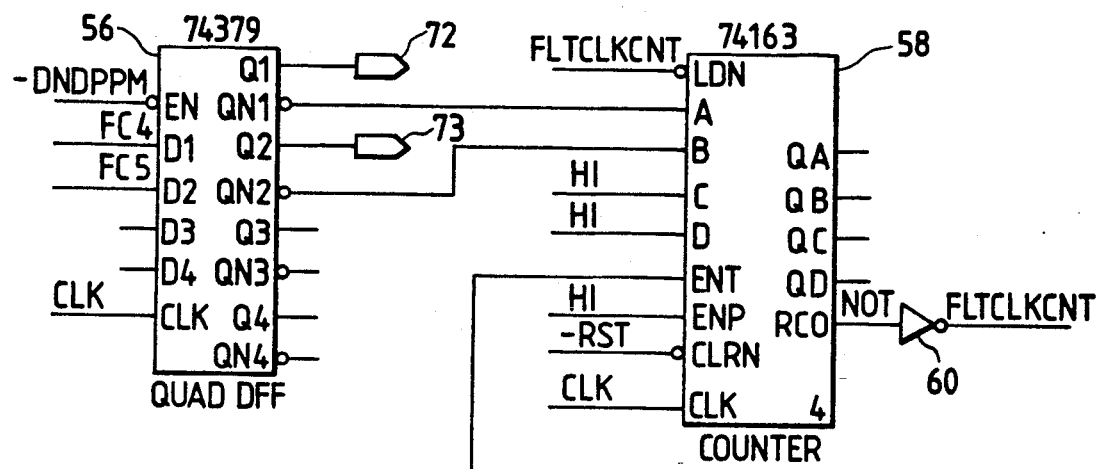
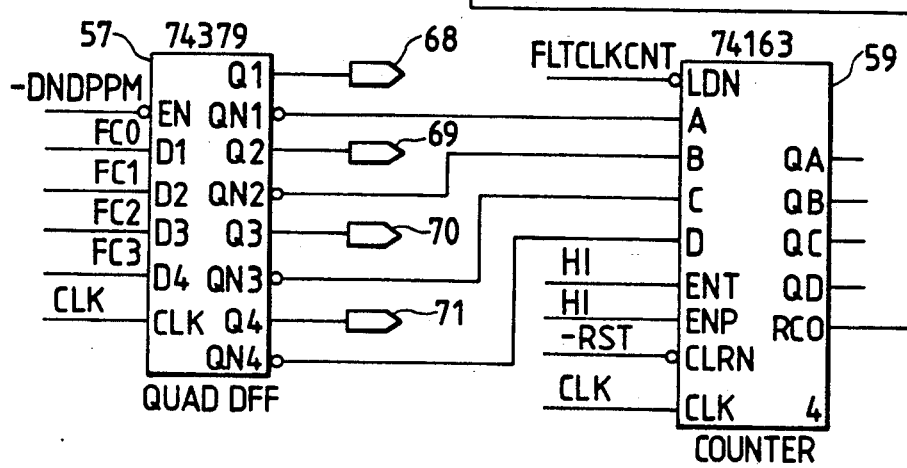
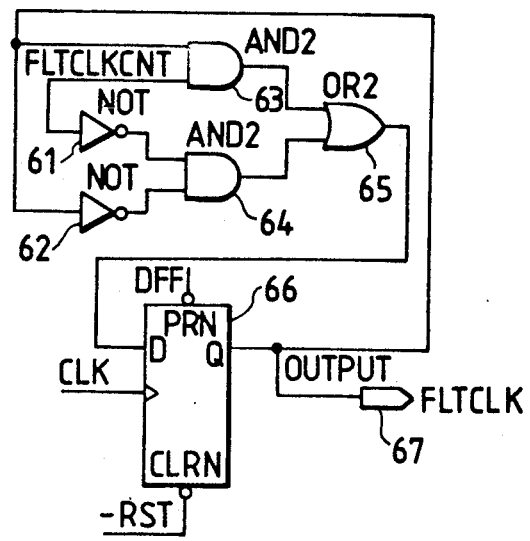

DEMODULATION PROCESSING CIRCUIT WITH TIME INTERVAL COUNTING FEATURE

BACKGROUND OF THE INVENTION

1. Field of the Invention

The present invention relates to a demodulation circuit for demodulating modulated continuous binary signals and a camera with the demodulation circuit.

2. Related Background Art

The invention associated with a technique of this type, U.S. Pat. No. 4,964,139 is known, and has an arrangement shown in FIG. 10 and timing characteristics shown in FIG. 11.

A binary information decoder circuit 100 shown in FIG. 10 comprises a read/write magnetic head 101, a pre-amplifier 102 for amplifying the output signal from the magnetic head, a filter 103 for removing an unnecessary component from the amplified output, a post-amplifier 104 for amplifying the output signal from the filter 103, a detector 105 (including a negative peak detector (NPD) 106 and a positive peak detector (PPD) 107) for detecting necessary signal components from the output signal from the post-amplifier 104, a delay circuit 108 connected to the NPD 106, a flip-flop circuit 109, which is set in response to the output from the delay circuit 108, and is cleared in response to the output from the PPD 107, a clock circuit 110 for generating a clock signal, and an up/down counter 111 for counting up/down the output from the flip-flop circuit 109.

The most significant bit (MSB) of the output from the up/down counter 111 and the output (CLOCK) from the NPD 106 are supplied to a computer 112.

In this circuit, as shown in FIG. 11, a pulse read signal (B) from the magnetic head 101 appears in synchronism with the leading and trailing edges of a modulated data waveform (A), and corresponding threshold peaks (C) of the read signal (B) are detected by the NPD 106 and the PPD 107. The flip-flop circuit 109 is driven by the outputs (D) from the NPD 106 and the PPD 107.

Modulation in this case is made such that when a data signal rises before a time ½ the interval of the clock signal (C) (left side of FIG. 11), it indicates "0"; when the data signal rises after the time (right side of FIG. 11), it indicates "1".

However, according to this prior art, since a count-down operation continues even after an overflow signal is output in a count-down mode, the overflow signal (MSB=1) becomes MSB=0, and a signal to be demodulated to "0" is undesirably demodulated to "1".

When the clock interval (C) in FIG. 11 becomes larger than the count value of the counter 111, an overflow signal (MSB=1) is undesirably output even in a count-up mode, and a signal to be demodulated to "1" is undesirably demodulated to "0".

SUMMARY OF THE INVENTION

One aspect of the application is to provide an apparatus, which can perform proper data detection by latching an overflow signal generated when a counter overflows upon detection of the duty of a pulse position modulation signal read by a head.

Another aspect of the application is to provide, in association with the above-mentioned aspect, an apparatus for latching an overflow signal generated when a counter overflows upon detection of the duty of a pulse position modulation signal in an apparatus for performing data detection by reading data recorded on a film by a head.

Another aspect of the application is to provide a camera for detecting a film feed speed by detecting a pulse position modulation signal read by a head, and performing data processing.

Another aspect of the application is to provide, in association with the above-mentioned aspect, a camera for detecting a film feed speed or feed position by detecting a pulse position modulation signal, and determining a write frequency or a write start timing of a head.

Another aspect of the application is to provide a camera for detecting a film feed speed by detecting a pulse position modulation signal, and adjusting the filter characteristics of a filter circuit or the gain of an amplifier for a signal to be detected by a head.

Other objects of the present invention will become apparent from the following description of the embodiment taken in conjunction with the accompanying drawings.

BRIEF DESCRIPTION OF THE DRAWINGS

FIG. 34 is a circuit diagram showing the details of the logic circuit shown in FIG. 31.

DETAILED DESCRIPTION OF THE PREFERRED EMBODIMENT

The preferred embodiments of the present invention will be described hereinafter with reference to the accompanying drawings.

Figure 1:
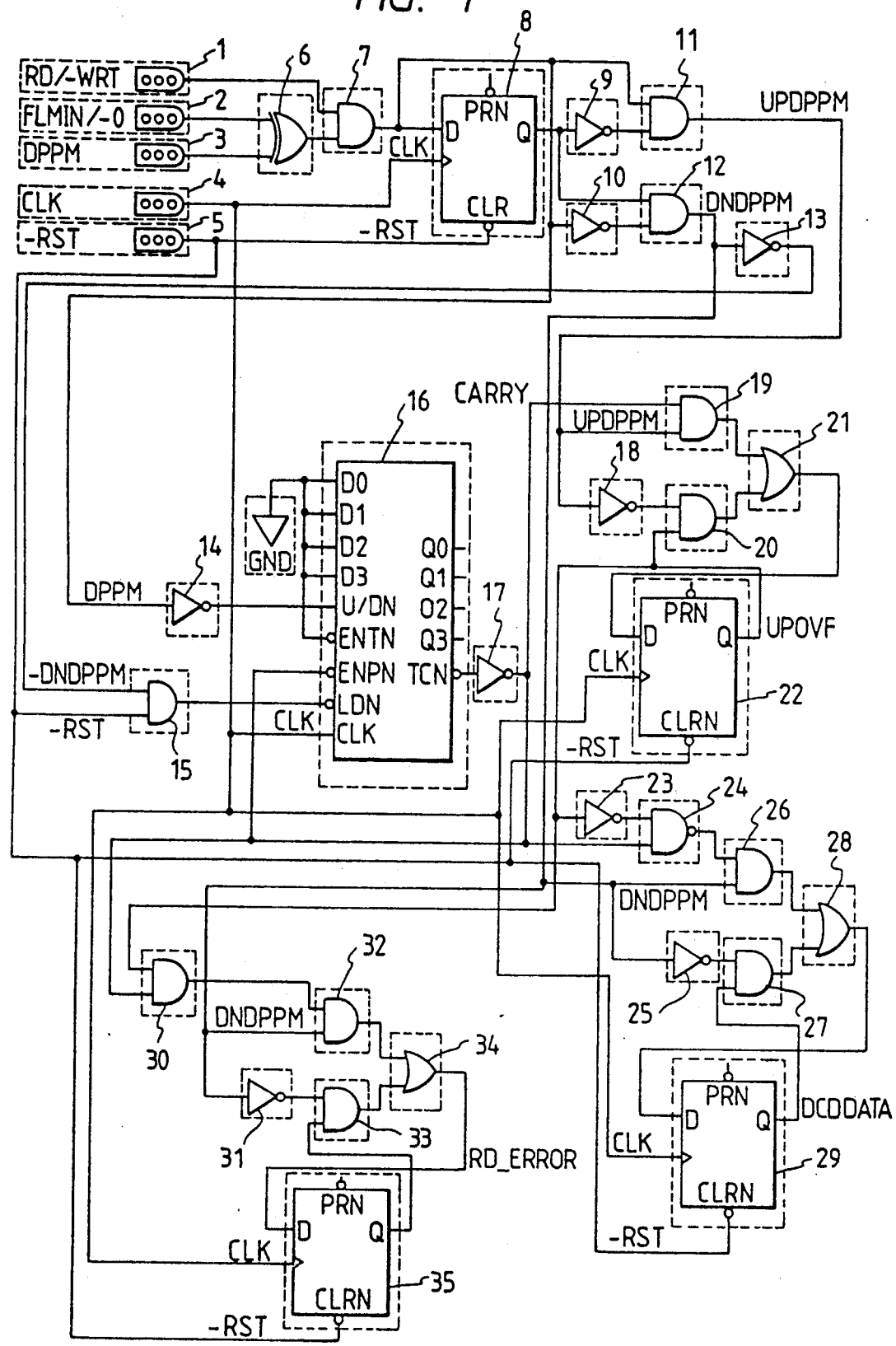
FIG. 1 is a circuit diagram showing a demodulation circuit according to the first embodiment of the present invention.

FIG. 1 is a circuit diagram showing a demodulation circuit according to an embodiment of the present invention, and FIGS. 2 to 7 are timing charts showing the operation of the embodiment shown in FIG. 1.

The demodulation circuit shown in FIG. 1 comprises input terminals 1 to 5, an exclusive-OR gate (EXOR) 6, AND gates (ANDs) 7, 11, 12, 15, 19, 20, 26, 27, 30, 32, and 33, D-flip-flop circuits (DFFs) 8, 22, 29, and 35, NOT gates (NOTs) 9, 10, 13, 14, 17, 18, 23, 25, and 31, a 4-bit up/down counter 16 (e.g., commercially available IC "SN74169"), OR gates (ORs) 21, 28, and 34, and a NAND gate (NAND) 24.

The 2-input EXOR 6 is connected to the input terminals 2 and 3, and its output terminal is connected to one input terminal of the AND 7. The other input terminal of the AND 7 is connected to the input terminal 1, and its output terminal is connected to the D terminal of the DFF 8. The clock terminal of the DFF 8 is connected to the input terminal 4, and the clear (CLR) terminal thereof is connected to the input terminal 5. The output terminal (Q terminal) of the DFF 8 is connected to the NOT 9 and one input terminal of the AND 11, and the outputs from the NOT 9 and the AND 7 are input to the AND 11. The output terminal of the AND 7 is connected to the input terminal of the NOT 10, and the outputs from the NOT 10 and the DFF 8 are input to the AND 12. The AND 11 detects the leading edge of a pulse position modulation (PPM) signal, and the AND 12 detects the trailing edge of the PPM signal. The EXOR 6, the AND 7, the DFF 8, the NOTs 9 and 10, and the ANDs 11 and 12 constitute a digital differential circuit.

The output terminal of the AND 12 is connected to the input terminal of the NOT 13, and the output terminal of the NOT 13 is connected to one input terminal of the AND 15. The other input terminal of the AND 15 is connected to the input terminal 5. The output terminal of the NOT 14 is connected to the up/down (U/DN) terminal of the up/down counter 16, and the output terminal of the AND 15 is connected to the load (LDN) terminal of the counter 16. The output terminal (TCN) of the up/down counter 16 is connected to the input terminal of the NOT 17, and the output terminal of the NOT 17 is connected to one input terminal of each of the ANDs 19 and 30. The other input terminal of the AND 19 is connected to the output terminal of the AND 11, and the output terminal thereof is connected to one input terminal of the OR 21. The AND 11 is further connected to the input terminal of the NOT 18, and the output terminal of the NOT 18 is connected to one input terminal of the AND 20. The output terminal of the AND 20 is connected to the other input terminal of the OR 21. The output terminal of the OR 21 is connected to the D terminal of the DFF 22, and an UPOVF signal output from the Q output terminal of the DFF 22 is supplied to the other input terminal of the AND 20 and the input terminal of the NOT 23.

The output terminal of the NOT 23 is connected to one input terminal of the NAND 24, and the other input terminal of the NAND 24 receives a CARRY signal output from the up/down counter 16. The output terminal of the NAND 24 is connected to one input terminal of the AND 26, and the other input terminal of the AND 26 and the input terminal of the NOT 25 receive the output from the AND 12. The output terminal of the NOT 25 is connected to one input terminal of the AND 27, and the output terminal of the AND 27 and the output terminal of the AND 26 are respectively connected to the input terminals of the OR 28. The output terminal of the OR 28 is connected to the D terminal of the DFF 29, and the Q terminal of the DFF 29 is connected to the other input terminal of the AND 27.

Furthermore, the output terminal of the AND 30, which receives the CARRY signal output from the up/down counter 16, and the output from the DFF 22, is connected to one input terminal of the AND 32, and the other input of the AND 32 and the input terminal of the NOT 31 are connected to the output terminal of the AND 12. The output terminal of the NOT 31 is connected to one input terminal of the AND 33, and the output terminal of the AND 33 is connected to one input terminal of the OR 34. The other input terminal of the OR 34 is connected to the output terminal of the AND 32, and the output terminal of the OR 34 is connected to the D terminal of the DFF 35. The output from the Q terminal of the DFF 35 is supplied as an RD ERROR signal to the other input terminal of the AND 33.

In the above-mentioned arrangement, the input terminal 4 receives a reference clock (CLK) (1 $\mu$s in this case). The input terminal 1 receives a read (RD)/write (WRT) signal. When the RD/WRT signal is at "H" level (logic 1), this circuit is set in a read state; when the RD/WRT signal is at "L" level (logic 0), the circuit is set in a write state, and output decode data cannot be changed. The input terminal 3 receives a digital pulse position modulation (DPPM) signal, and the input terminal 5 receives a reset (RST) signal. When the RST signal is at "L" level (0), the DFFs 8, 22, 29, and 35 and the 4-bit up/down counter 16 are reset, and their outputs go to "L" level.

An FLMIN/-0 signal is set to be "0" or "1" according to the film feed direction, and when a film is fed in a direction to be extracted from a cartridge, the FLMIN/-0 signal = "0" is output.

A DPPM signal defines data (1 or 0) as the ratio of "H"- and "L"-level signals per period of a digital signal obtained by converting a pulse position modulation signal magnetically recorded on the film. The DPPM signal is read out by a magnetic head during the film feed operation.

Assume that the read state is set currently, and the FLMIN/-0 signal = "1" is output.

Also, assume that a DPPM signal read out in this state has waveforms shown in FIGS. 2 to 7.

In FIGS. 2 to 7, the time is plotted along the abscissa. In FIGS. 2 to 7, a DDPPM signal is obtained by delaying a DPPM signal by one clock (1 $\mu$s) by the DFF 8. An UPDPPM (up DPPM) signal goes to "H" level (1) in response to the leading edge of a DPPM signal until the next CLK signal goes to "H" level. A DNDPPM (down DPPM) signal goes to "H" level in response to the trailing edge of the DPPM signal until the next CLK signal goes to "H" level. A UPOVF (up overflow) signal holds a carry output in response to the leading edge of the DPPM signal when the up/down counter 16 outputs the CARRY signal. A DCDDATA signal is a demodulated signal, i.e., a decoded data signal.

An RD ERROR (read error) signal is set at logic "1" when the carry outputs are generated in both the count-up and count-down modes of the up/down counter 16 according to the UPOVF signal and the CARRY output from the up/down counter 16 in response to the trailing edge of the DPPM signal.

Figure 2:
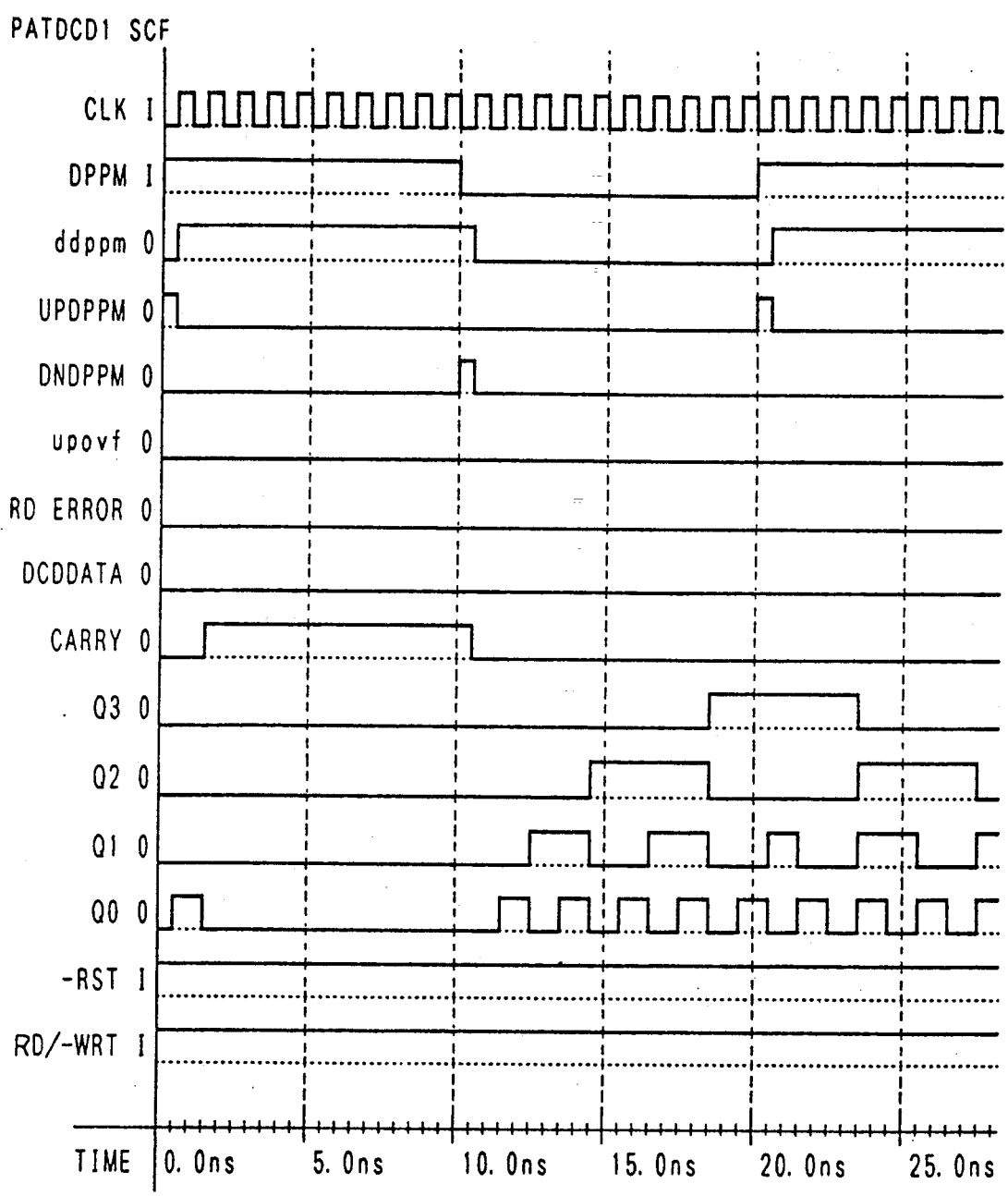
FIG. 2 is a timing chart showing an operation of the embodiment shown in FIG. 1.

In FIG. 2, the DPPM signal goes to logic "0" upon elapse of 10 $\mu$s. Since the CLK signal goes to logic "1" upon elapse of 0.5 $\mu$s, the DDPPM signal goes to logic "0" upon elapse of 10.5 $\mu$s. The DNDPPM signal goes to logic "1" during a time interval between 10 $\mu$s and 10.5 $\mu$s according to the DPPM and DDPPM signals. Therefore, a DNDPPM signal obtained by inverting the DNDPPM signal is input to the LDN terminal of the up/down counter 16, and the counter 16 loads inputs D3 to D0 = 0. Therefore, the outputs Q3 to Q0 = 0 are obtained.

Since the inverted signal of the DPPM signal is input to the U/DN terminal of the counter 16, the counter 16 is set in a count-up state while the DPPM signal is at logic "0".

The counter 16 generates a carry output when the outputs Q0 to Q3 = 1 in the count-up state, and when the outputs Q0 to Q3 = 0 in a count-down state. When the carry output is input to the ENPN terminal, the counter 16 inhibits the count operation.

When the counter 16 loads "0", as described above, the counter 16 performs a count-up operation while the DPPM signal is at logic "0". When the DPPM signal is inverted to logic "1" after an elapse of 20.0 $\mu$s, the UPDPPM signal is input to one input terminal of the AND 19. Since the other input terminal of the AND 19 receives the output from the NOT 17, if a carry output is generated at that time, the Q output, i.e., the UPOVF signal from the DFF 22 goes to logic "1". In FIG. 2, since no carry output is generated, the UPOVF signal is held at logic "0".

Figure 3:
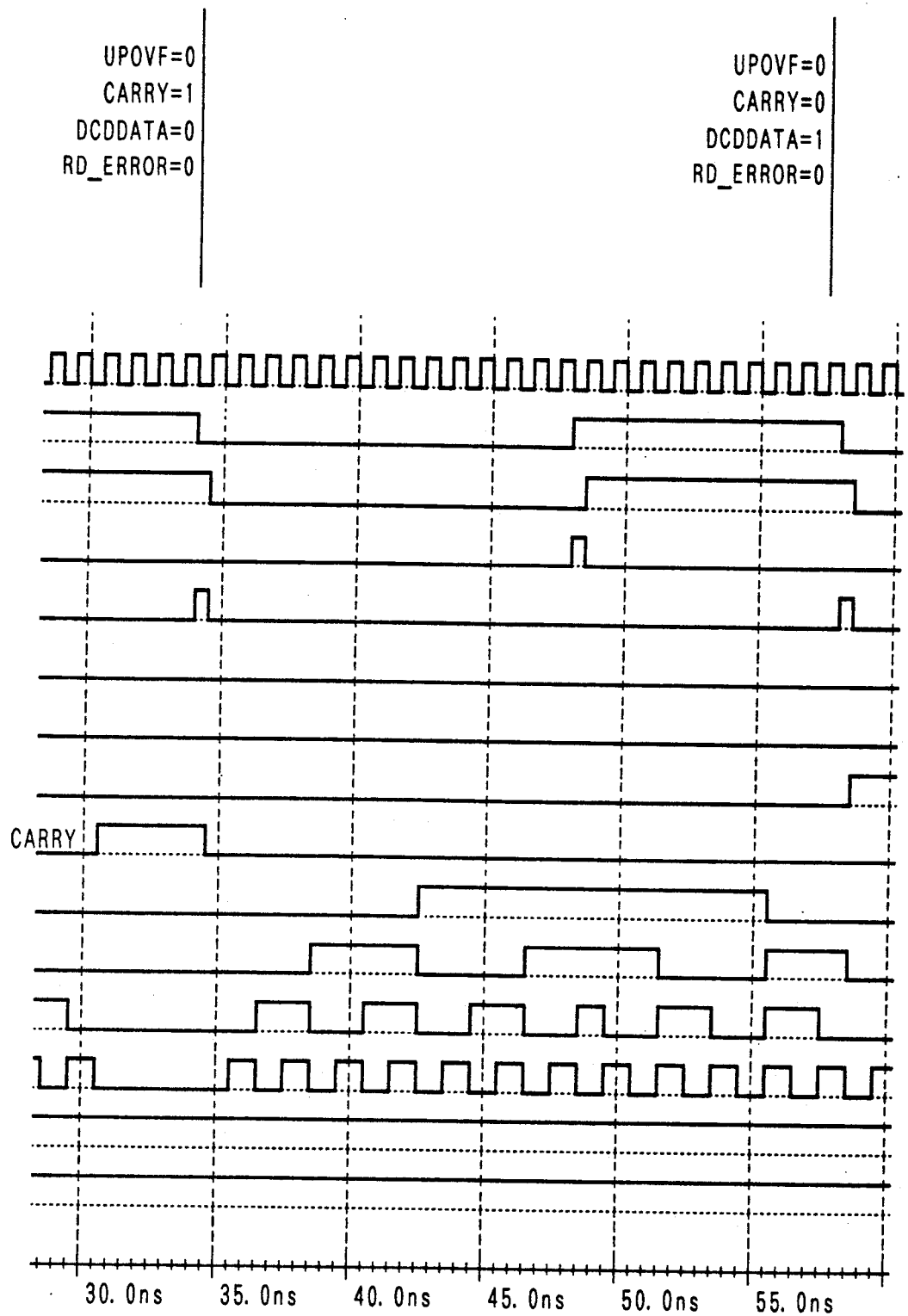
FIG. 3 is a timing chart showing the operation of the embodiment shown in FIG. 1.

When the DPPM signal is inverted to logic "1", the counter 16 transits to the count-down state. During the count-down operation, when the count values Q0 to Q3 from the counter 16 become "0", a carry output is generated (FIG. 3). Thus, the counter 16 stops the count operation at that time. Thereafter, when the signal DPPM goes from logic "1" to logic "0", the abovementioned DNDPPM signal is input to one input terminal of the AND 26. On the other hand, when the carry output is generated at that time, and the UPOVF signal is at logic "0", the output DCDDATA from the DFF 29 goes to logic "0". Since the DNDPPM signal is also input to the AND 32, the output RD ERROR from the DFF 35 goes to logic "1" when the UPOVF signal and the carry output are at logic "1" at the generation timing of the DNDPPM signal.

When the UPOVF signal and the carry output are at logic "0" at the generation timing of the DNDPPM signal, the output DCDDATA goes to logic "1". When the UPOVF signal is at logic "1" and the carry output is at logic "0" upon generation of the DNDPPM signal, the output DCDDATA goes to logic "1". The states of the UPOVF signal and the carry output, and the states of the DCDDATA and RD ERROR outputs as a result of the states of the former signals upon generation of the DNDPPM signal are as follows.

| UPOVF | CARRY | DCDDATA | RD ERROR |
|-------|-------|---------|----------|
| 0     | 0     | 1       | 0        |
| 0     | 1     | 0       | 0        |
| 1     | 0     | 1       | 0        |
| 1     | 1     | 1       | 1        |

The UPOVF signal holds the CARRY signal as follows. That is, when the up/down counter 16 performs a count-up operation from when the DNDPPM signal rises until the UPDPPM signal rises, and the count time is longer than that for 16 counts, the CARRY output of the counter 16 goes to logic "1", and the CARRY signal is latched by the DFF 22 while UPDPPM = 1. The CARRY signal is held by the UPOVF signal until the next UPDPPM = 1.

The read error (RD ERROR) signal is generated when CARRY = 1 is set in both the count-up and count-down modes of the up/down counter 16. That is, in this state, since a time interval between DPPM = 0 and DPPM = 1 becomes longer than a time interval which can be counted by the up/down counter 16, the logic becomes unstable, and an error display is made.

As described above, since data is constituted by a period of DPPM = "0" and a period of DPPM = "1", when the period of DPPM = "1" is shorter by a predetermined amount or more than the period of DPPM = "0", a carry signal is output in the count-up operation by the counter 16 during the period of DPPM = "0", and the UPOVF signal is set at logic "1". In the following count-down operation executed during the period of DPPM = "1", no carry signal is generated. Therefore, the DCDDATA output is determined to be "1", as shown in the table above. Contrary to this, when the period of DPPM="1" is longer by a predetermined amount or more than the period of DPPM="0", no carry signal is generated in the count-up operation by the counter 16, and the UPOVF signal is set at logic "0". In the following count-down operation executed during the period of DPPM="1", a carry signal is generated, and the DCDDATA output is set to be "0". Similarly, when the UPOVF signal is set at logic "0" in the count-up operation, and no carry signal is generated in the count-down operation, the DCDDATA output is determined to be "1". In this manner, the value of data DCDDATA is determined according to the ratio of "1" to "0" of the readout DPPM signal.

Figure 4:
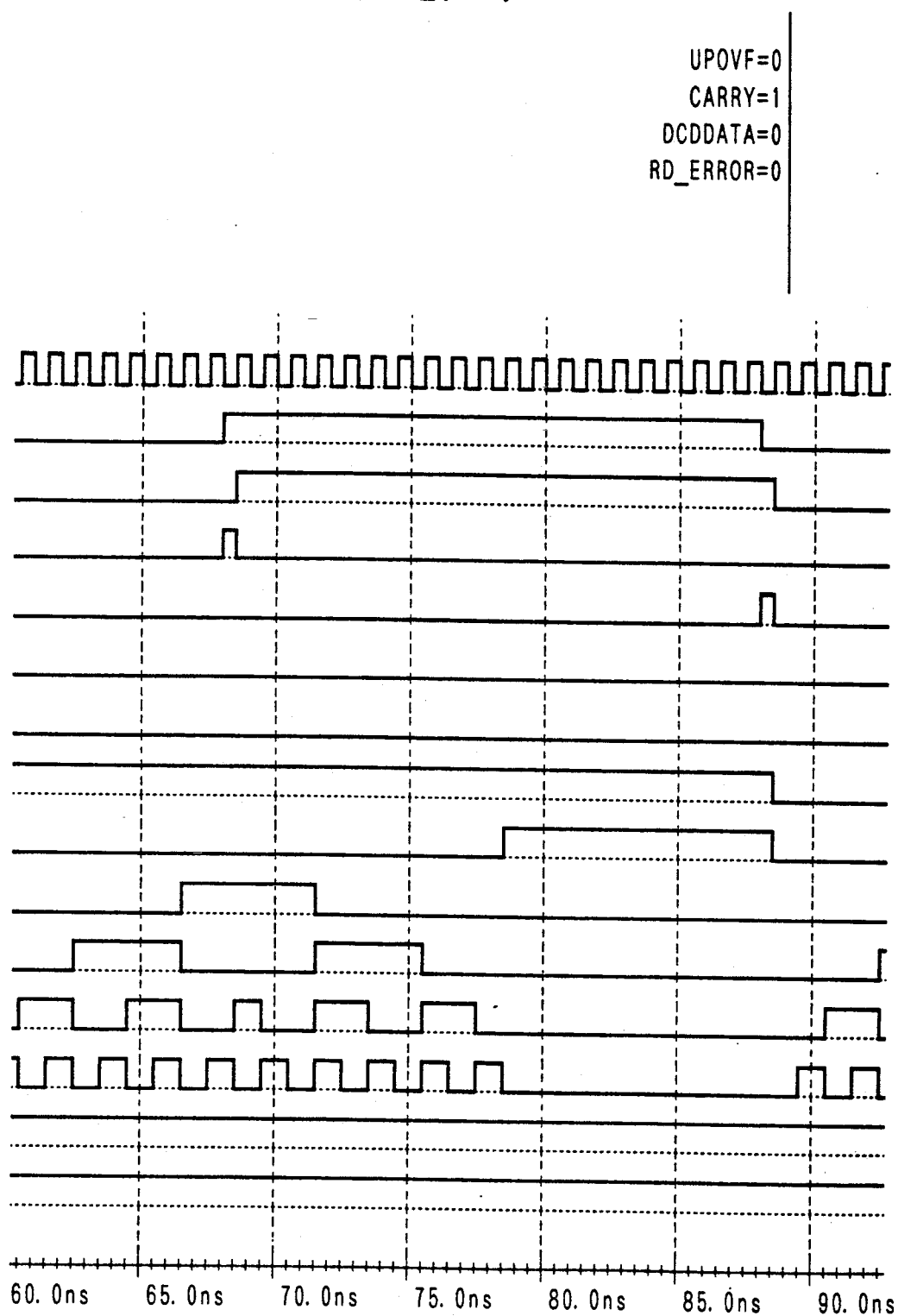
FIG. 4 is a timing chart showing the operation of the embodiment shown in FIG. 1.
Figure 5:
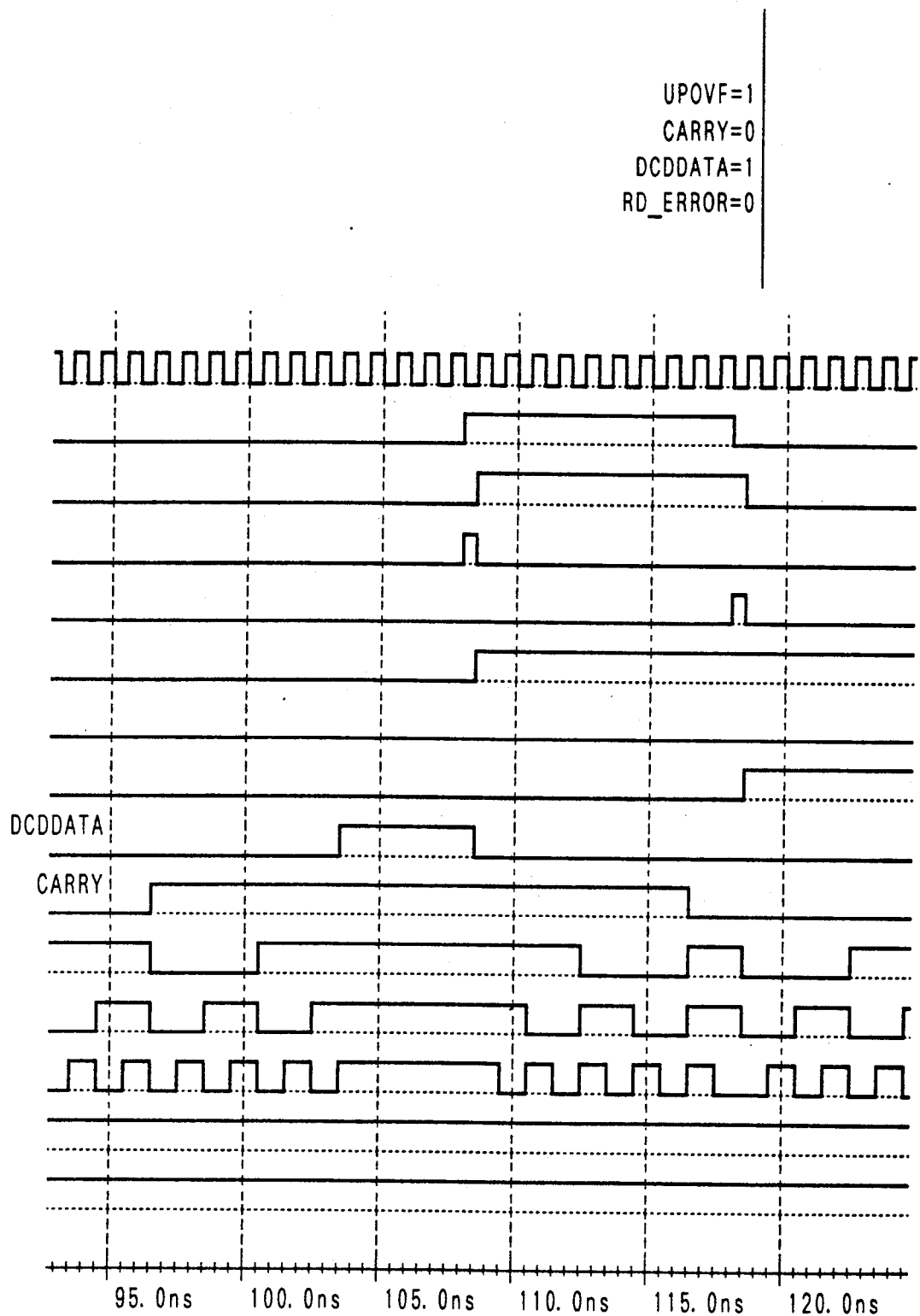
FIG. 5 is a timing chart showing the operation of the embodiment shown in FIG. 1.
Figure 6:
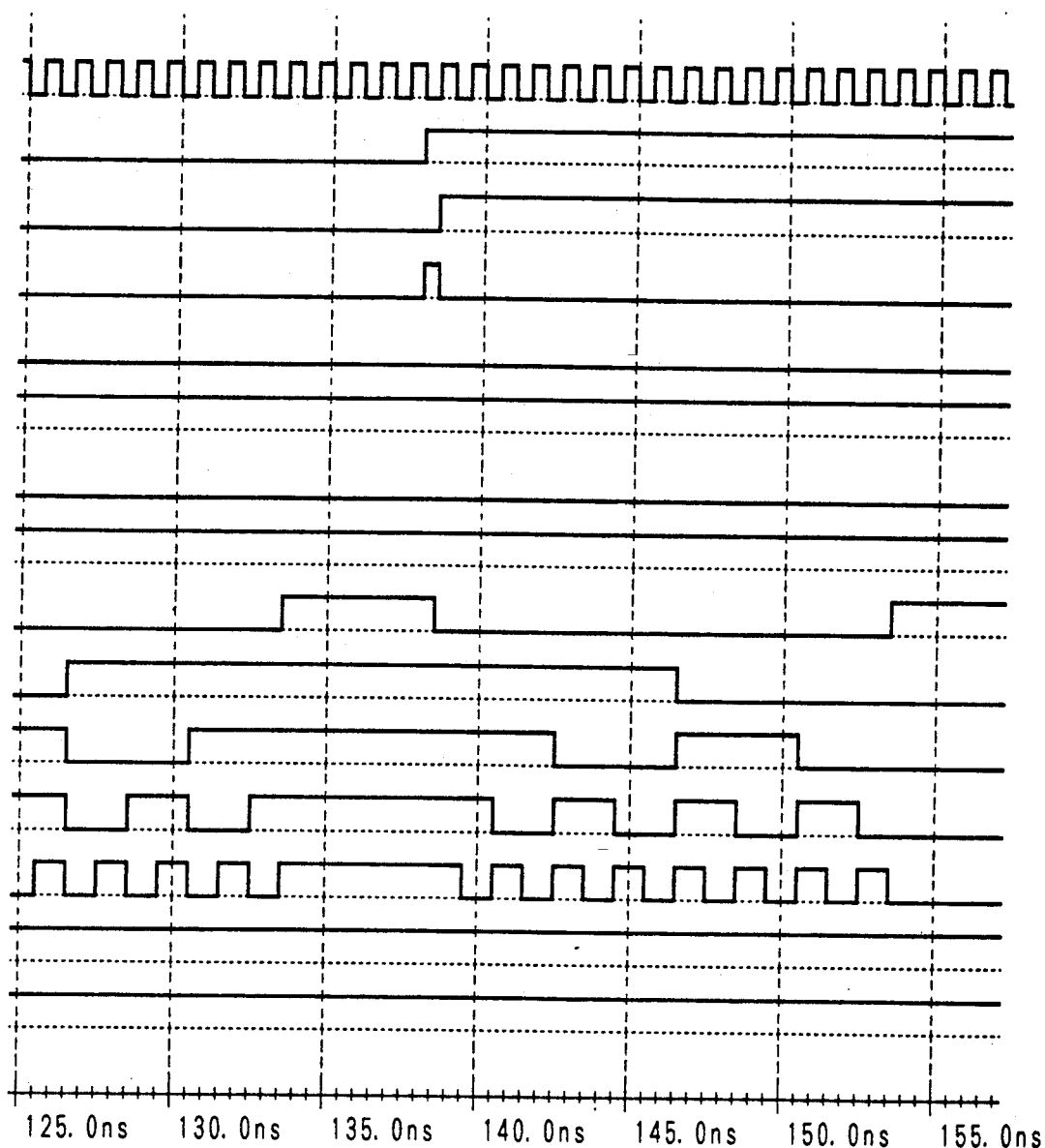
FIG. 6 is a timing chart showing the operation of the embodiment shown in FIG. 1.
Figure 7:
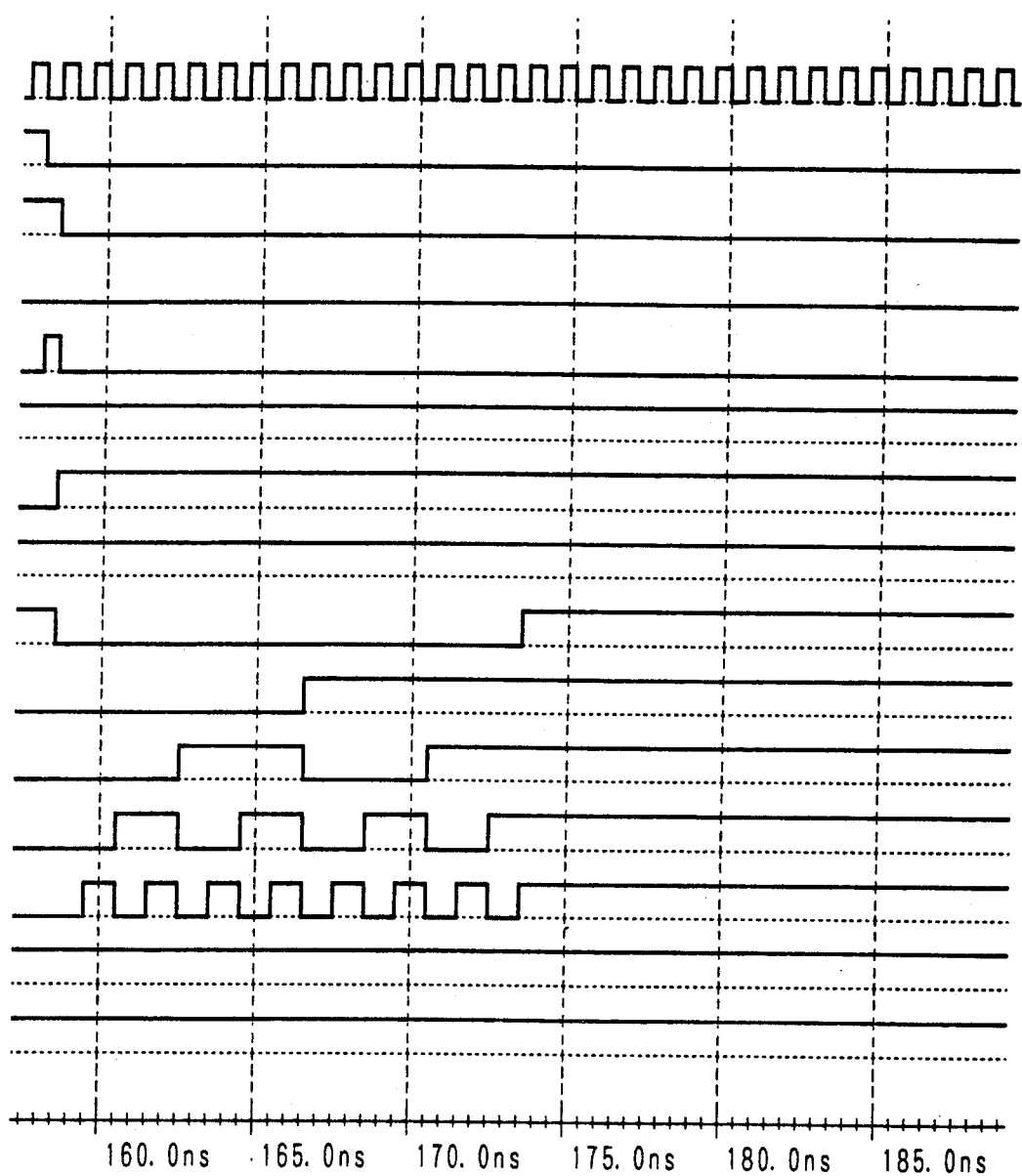
FIG. 7 is a timing chart showing the operation of the embodiment shown in FIG. 1.

The above-mentioned case of UPOVF="0" and CARRY="1" is presented during a time interval between 10 μs and 34 μs and a time interval between 58 μs and 88 μs in FIGS. 2 to 4. The case of UPOVF="0" and CARRY="0" is presented during a time interval between 34 μs and 58 μs in FIG. 3. The case of UPOVF="1" and CARRY="0" is presented during a time interval between 88 μs and 118 μs in FIGS. 4 and 5. The case of UPOVF="1" and CARRY="1" is presented during a time interval between 118 μs and 158 μs in FIGS. 5 to 7.

Figure 8:
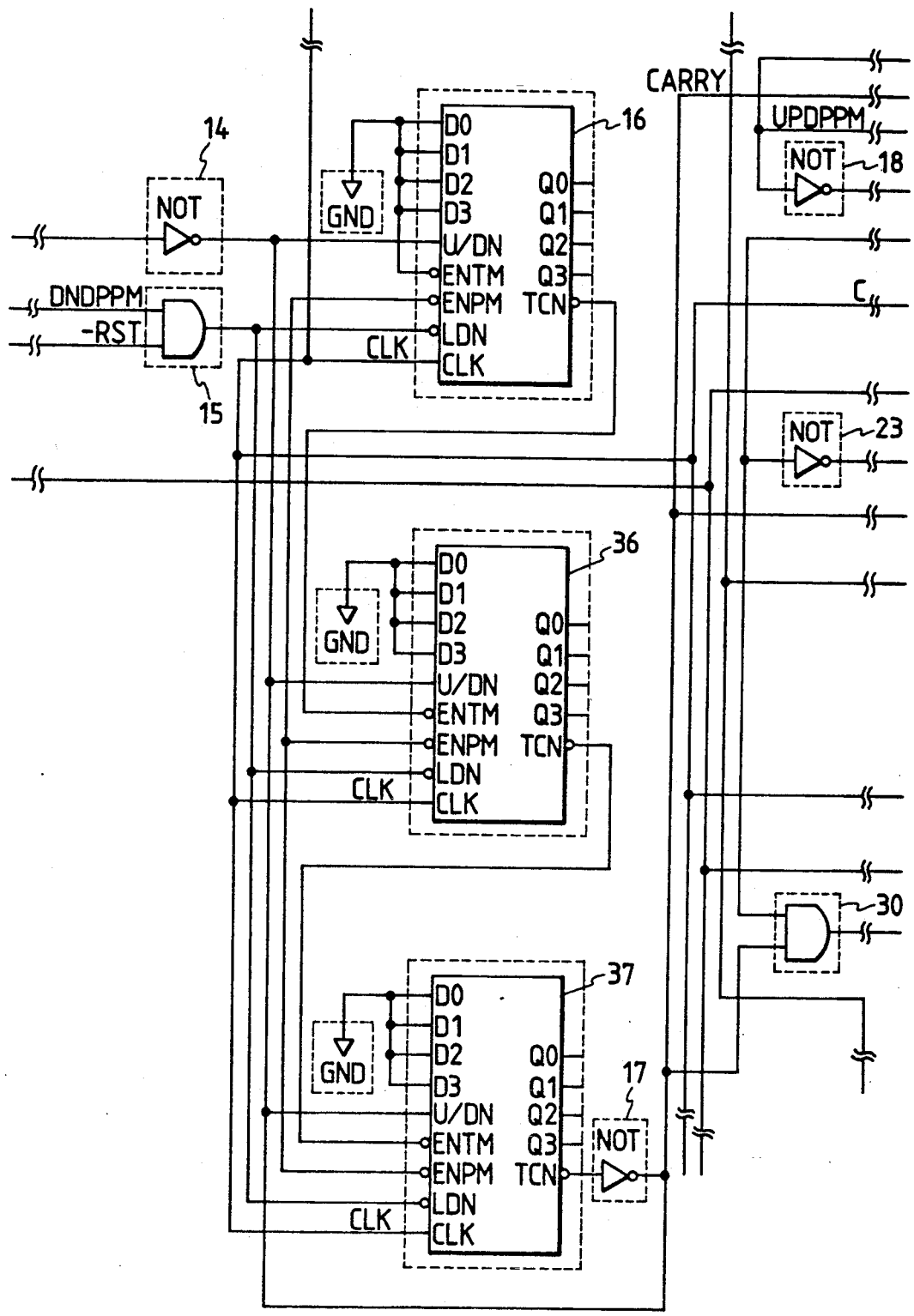
FIG. 8 is a circuit diagram showing an arrangement of main parts according to the second embodiment of the present invention.

FIG. 8 is a circuit diagram showing an arrangement of main parts according to the second embodiment of the present invention.

The arrangement shown in FIG. 8 is substantially the same as that of the first embodiment, except that up/down counters 36 and 37 ("SN74169" in this embodiment) are added. When the "L"-level interval of a DPPM signal changes, and when both the periods of DPPM="0" and "1" exceed 16 μs, an RD ERROR signal goes to logic "1", and a demodulated signal becomes indefinite. As the characteristic feature of this embodiment, the three 4-bit up/down counters 16, 36, and 37 are connected to form a 12-bit up/down counter. Thus, demodulation can be preformed without causing an error until both the periods of DPPM="0" and "1" exceed 40.96 μs.

Figure 9:
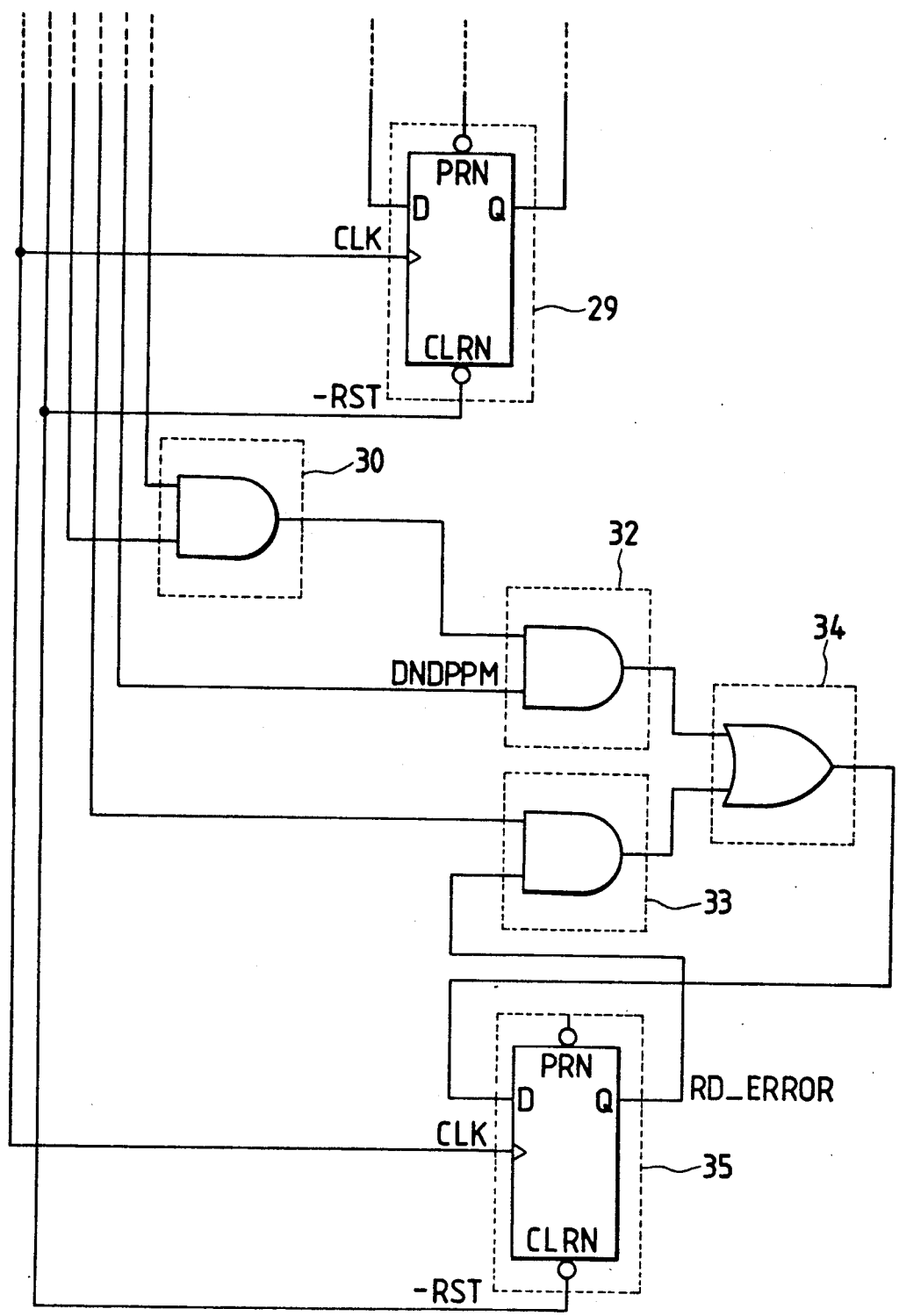
FIG. 9 is a circuit diagram showing an arrangement of main parts according to the third embodiment of the present invention.
Figure 10:
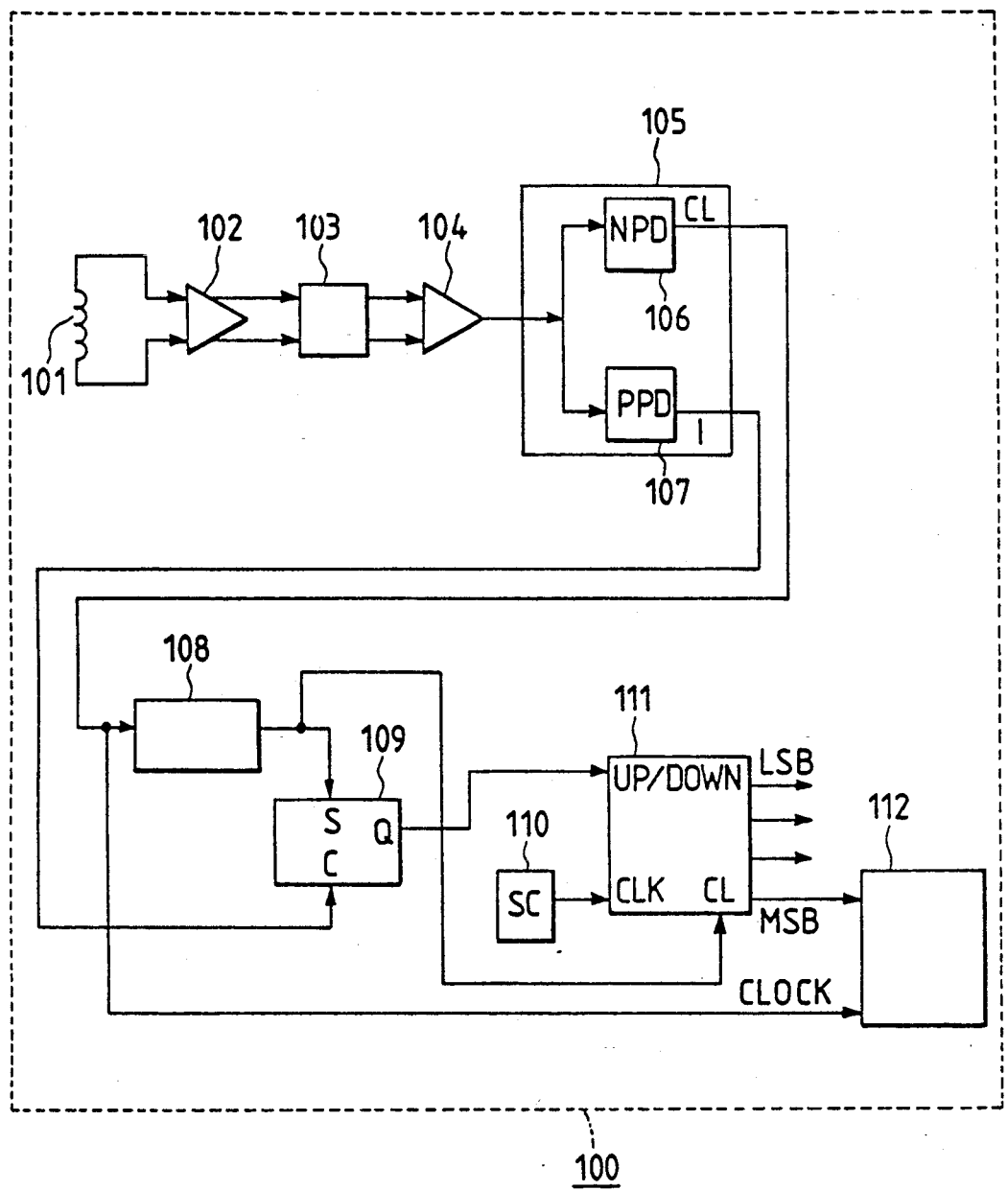
FIG. 10 is a block diagram showing a conventional demodulation circuit.
Figure 11:
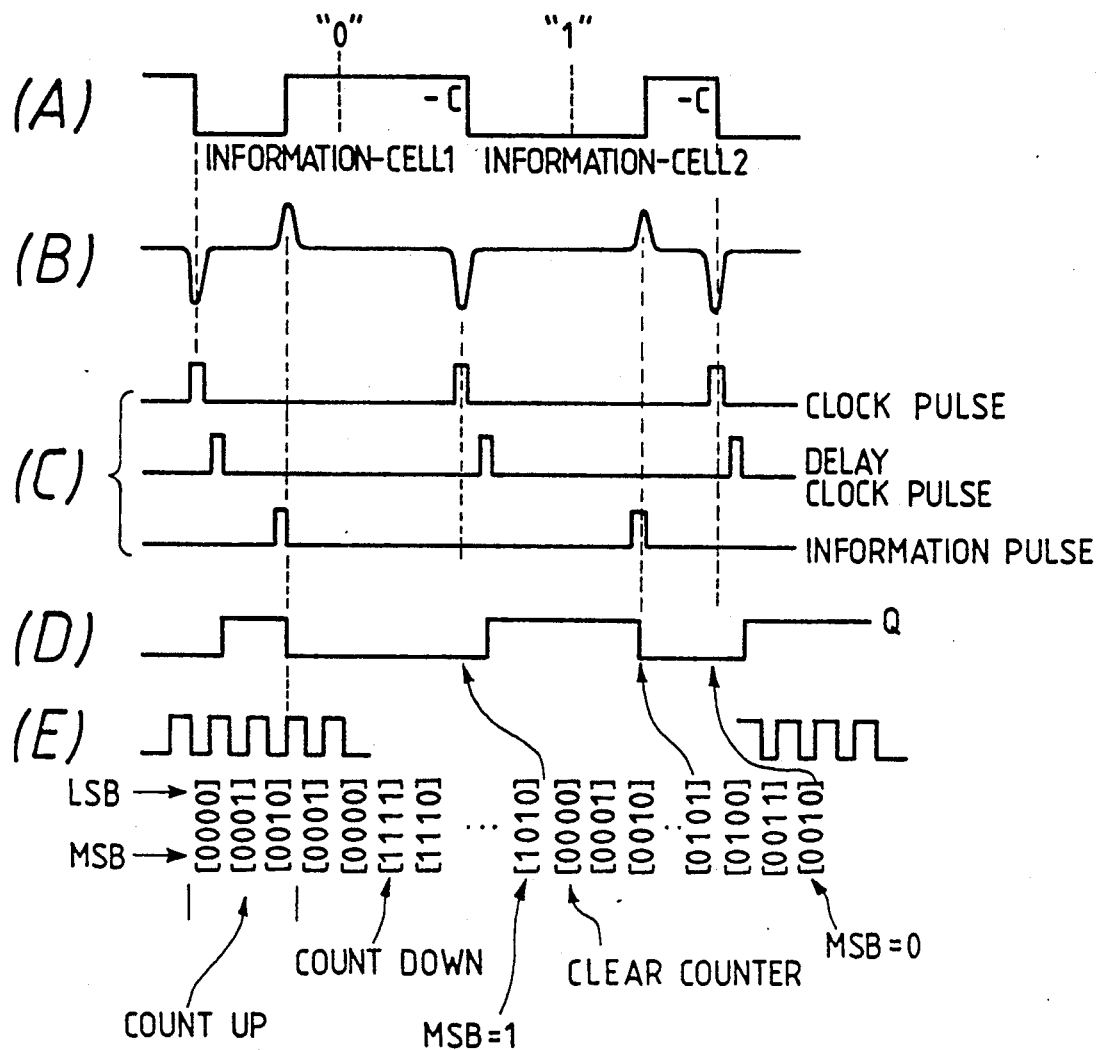
FIG. 11 is a timing chart showing an operation of the circuit shown in FIG. 10.

FIG. 9 is a circuit diagram showing an arrangement of main parts according to the third embodiment of the present invention.

The characteristic feature of this embodiment is that the NOT 31 is omitted from the arrangement shown in FIG. 1. Therefore, in this embodiment, when −RST="1" is set after −RST="0" and RD/−WRT="0", and when RD/−WRT="1" is then set, the output RD ERROR="1" of the DFF 35 is set. Once RD ERROR="1" is set, it is held until −RST="0" or RD/−WRT="0" is set.

In the embodiment shown in FIG. 1, the RD ERROR output changes together with the DCDDATA output when DPPM="1" changes to "0". However, in this embodiment, when a series of signals (e.g., signals for 8 bits) are input, if they include even one error bit, the error can be detected with reference to the RD ERROR signal after the signals are fetched.

As described above, according to the present invention, since a countermeasure against overflow of a counter is taken, demodulation can be normally performed when the counter overflows in the count-up or count-down operation.

The fourth embodiment of the present invention will be described below with reference to FIGS. 12 to 16.

Figure 12:
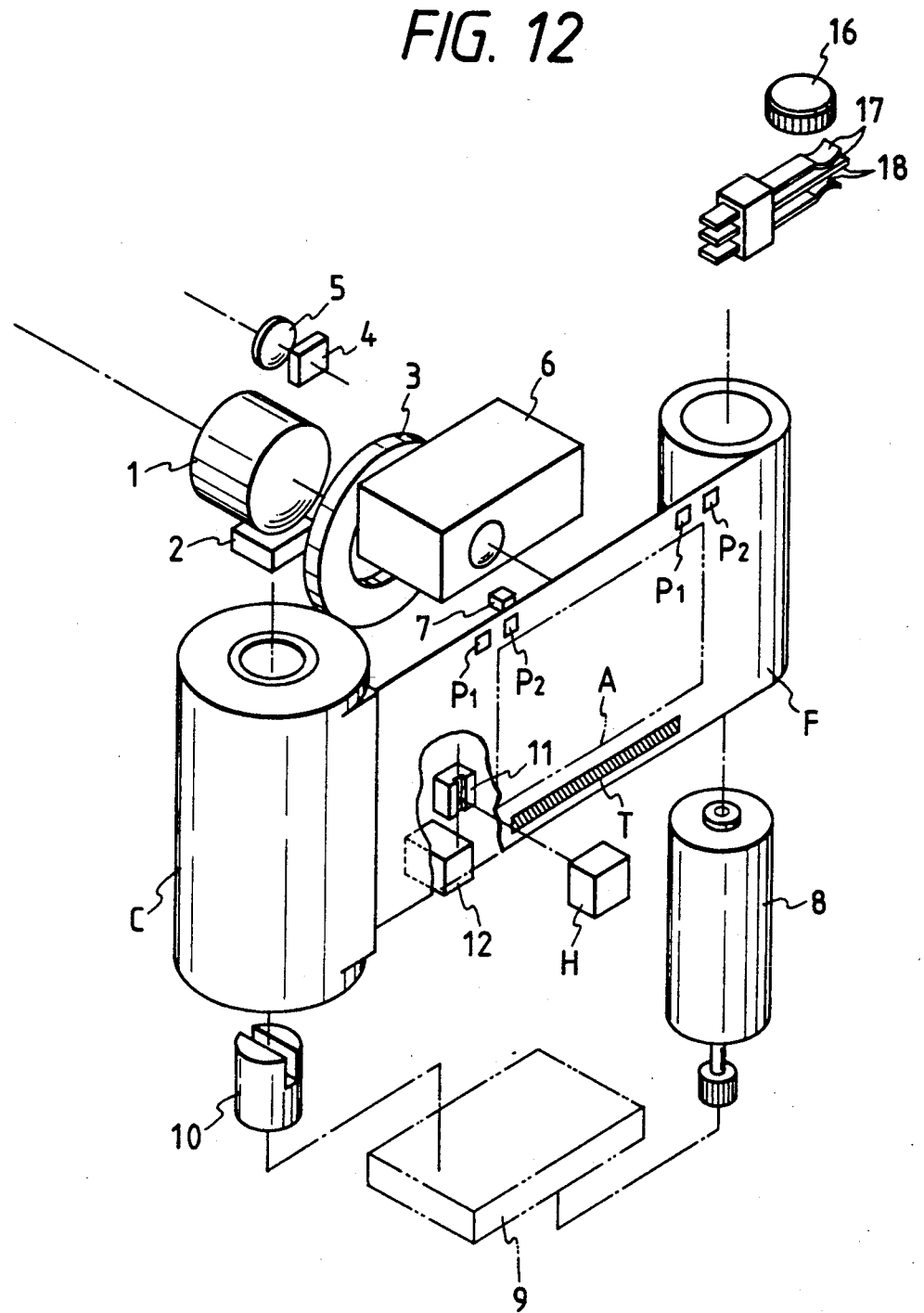
FIG. 12 is a perspective view showing the internal arrangement of main parts of a camera according to the fourth embodiment of the present invention.

FIG. 12 is a perspective view showing an internal arrangement of main part of a camera according to this embodiment.

In FIG. 12, the camera comprises a photographing lens 1, a block 2 including a lens actuator for driving the photographing lens and a lens encoder for generating a lens position signal, a lens shutter 3, a photometry sensor 4 for AE control, a lens 5 for determining the light-receiving angle of the photometry sensor 4, a block 6 including a distance measuring sensor 6a (to be described later) and a finder, a photoreflector 7 for detecting perforations P1 and P2 of a film F (to be described later), and generating a signal for detecting one frame of the film F, and a signal indicating an information write end timing, a film feed motor 8 arranged in a spool, a gear train 9 for decelerating the motor 8, and switching between winding and rewinding directions, and a rewind fork 10.

The camera also comprises a film cartridge C for storing the film F in a state wherein the leading end of the film is exposed from the cartridge. The film F has a magnetic recording portion (magnetic track T) on the base side, and the perforations P1 and P2 corresponding to a photographing frame A. Information is written on or read out from the magnetic track T on the film F using a magnetic head H. The film F is urged against the magnetic head H by a pad 11. The pad 11 has a central recess portion for improving the contact state between the film F and the head gap of the magnetic head. The camera further comprises a pad forward/backward movement control mechanism 12 for urging the pad 11 against the magnetic head H via the film F at a predetermined pressure in only a film feed operation, a release button 16, a switch (SW1) 17 for starting photometry and distance measuring operations, and a switch (SW2) 18 for opening a shutter and starting a film feed sequence.

Figure 13:
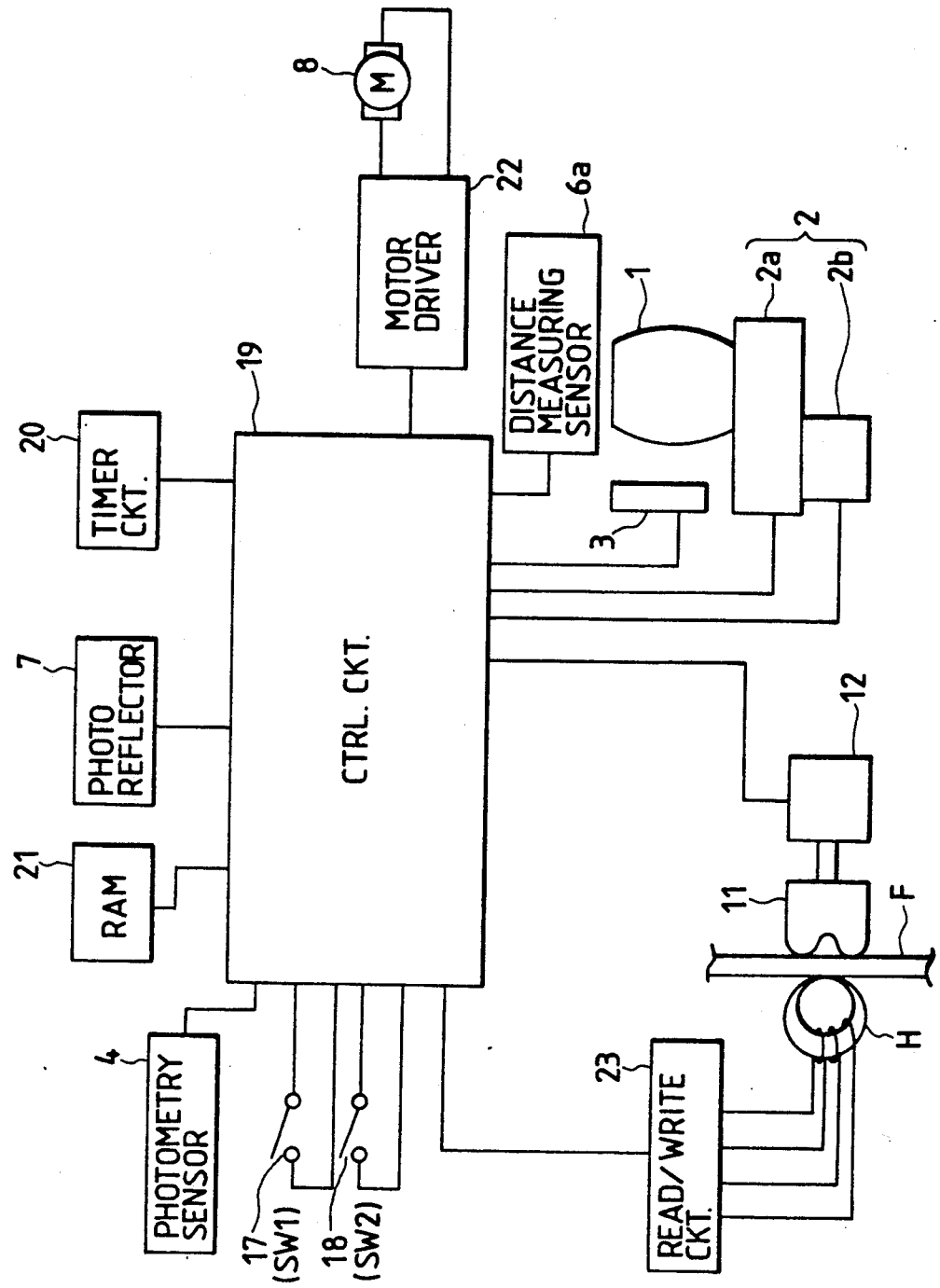
FIG. 13 is a block diagram showing main parts of the camera shown in FIG. 12.

FIG. 13 is a block diagram showing main parts of the camera.

Figure 16:
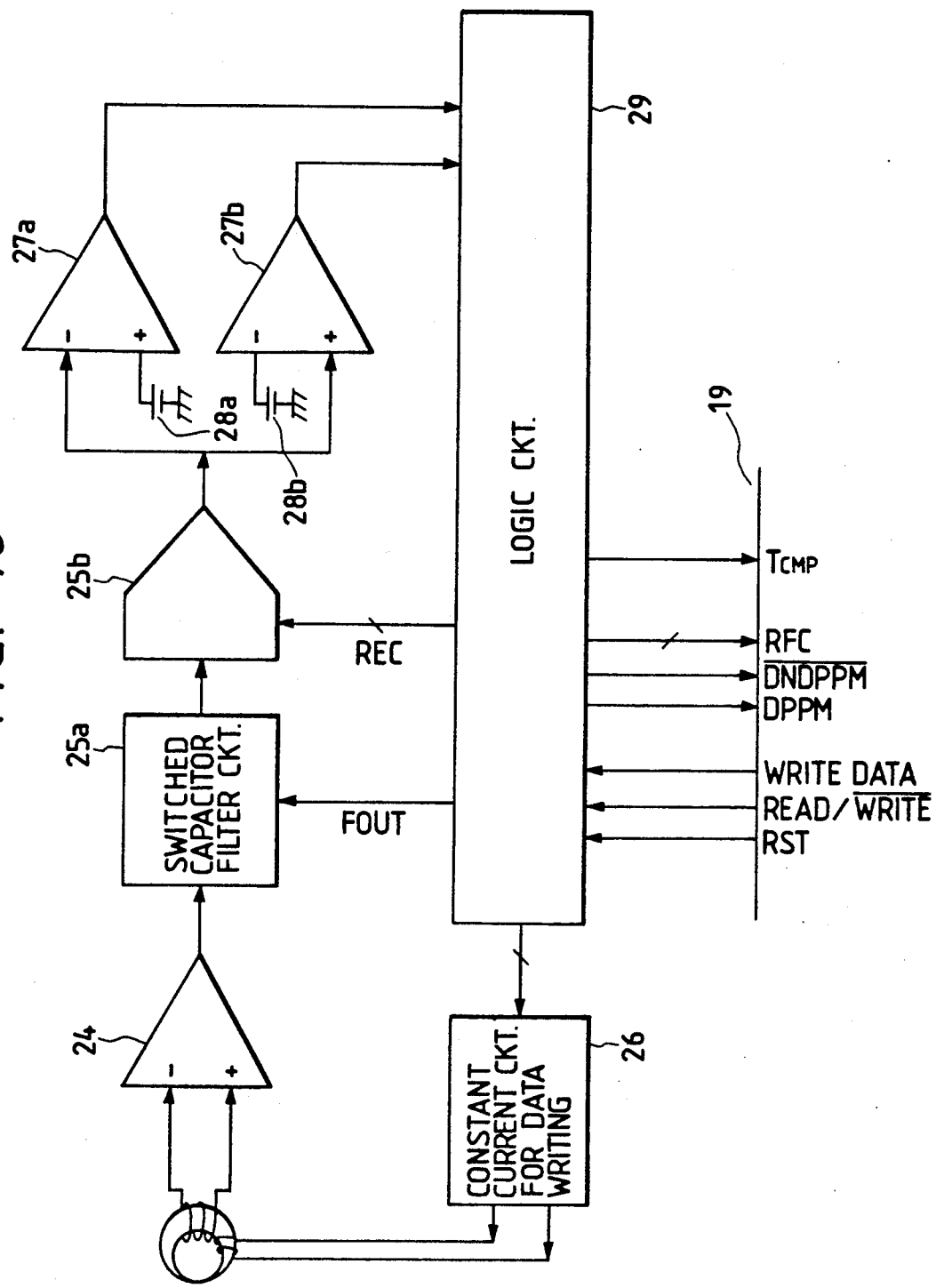
FIG. 16 is a circuit diagram showing the details of a read/write circuit 23 shown in FIG. 13.

The circuit shown in FIG. 13 comprises a control circuit 19 for controlling various operations of the camera, a known timer circuit 20, a RAM 21 for storing photographing information such as an aperture value, shutter speed, and the like upon a photographing operation, a read/write circuit 23 shown in detail in FIG. 16, and a motor driver 22 for driving the film feed motor 8.

Figure 14:
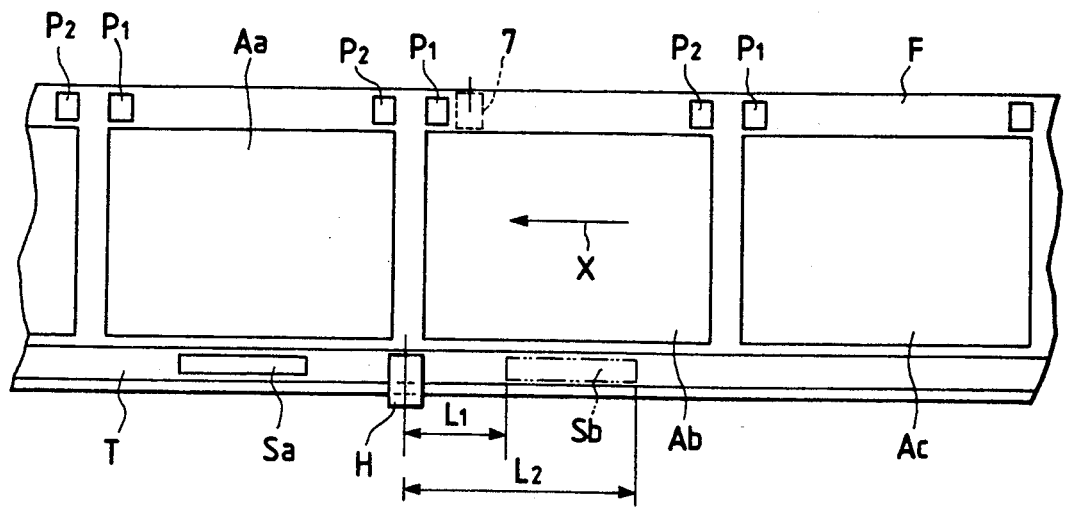
FIG. 14 is a front view showing the relationship between a photoreflector and a frame of photographic film in the embodiment shown in FIG. 12.

FIG. 14 is a view showing the relationship among the film F, the photoreflector 7, and the magnetic head H when the film F is viewed from a side opposite to the photographing lens 1.

In FIG. 14, a photographing frame Aa is an already photographed one, a photographing frame Ab is located at an aperture position, and is to be currently photographed, and a photographing frame Ac is to be photographed after the photographing frame Ab. The magnetic recording portion T of the film F is repetitively written with information associated with the film such as a film speed, film type, and the like. In the magnetic recording portion T, photographing information (e.g., a shutter speed), a photographing date, and the like have already been overwritten on a region Sa when the photographed frame Aa was wound up. In a region Sb, information is overwritten by the magnetic head H in future. An arrow X indicates the winding direction of the film F.

Figure 15:
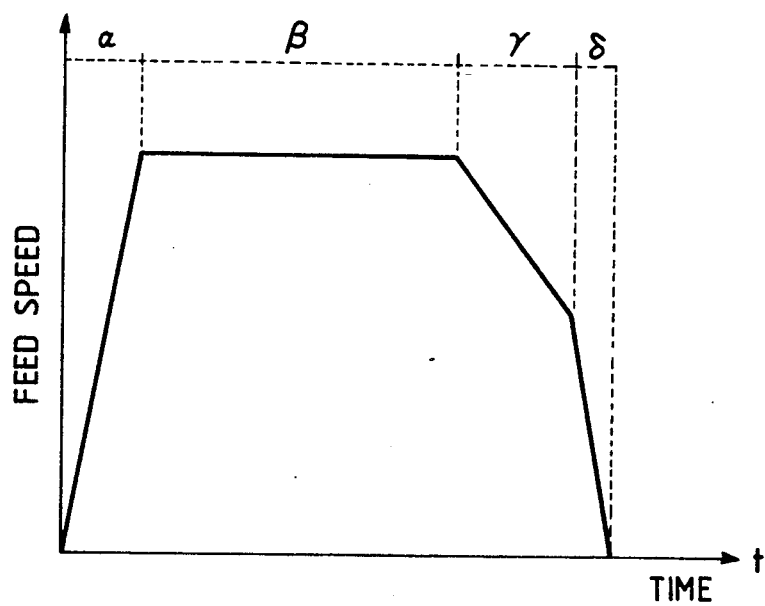
FIG. 15 is a graph showing the relationship between the film feed speed and time in the embodiment shown in FIG. 12.

FIG. 15 is a graph showing the relationship between the film feed speed and the time in correspondence with distances Li in FIG. 14. The details of FIG. 15 will be described later in the description of the operation.

FIG. 16 is a circuit diagram showing the details of the read/write circuit 23. The circuit 23 comprises a differential amplifier (e.g., AD524 available from Analog Devices Corp.) 24, a switched capacitor filter circuit (e.g., LTC1064-3 available from Linear Technology Corp.) 25a, a multiplier type D/A converter (e.g., DAC0830 available from National Semiconductor Corp.) 25b, comparators (e.g., LM2903 available from TI Corp.) 27a and 27b, reference voltage sources 28a and 28b, a constant current circuit 26 for data writing, and a logic circuit 29.

A magnetic reproduction signal from the magnetic head H is amplified by the differential amplifier 24, and the amplified signal is band-limited by the switched capacitor filter circuit 25a, thus improving the signal-to-noise ratio.

The output signal from the filter circuit 25a is input to the multiplier type D/A converter 25b, and is converted to a signal having a predetermined amplitude regardless of the feed speed of the film F.

The converted signal is input to the comparators 27a and 27b. When the signal voltage is lower than a voltage value supplied from the reference voltage source 28a, the comparator 27a outputs "1"; otherwise, it outputs "0". When the signal voltage is higher than a voltage value supplied from the reference voltage source 28b, the comparator 27b outputs "1"; otherwise, it outputs "0".

Figure 17:
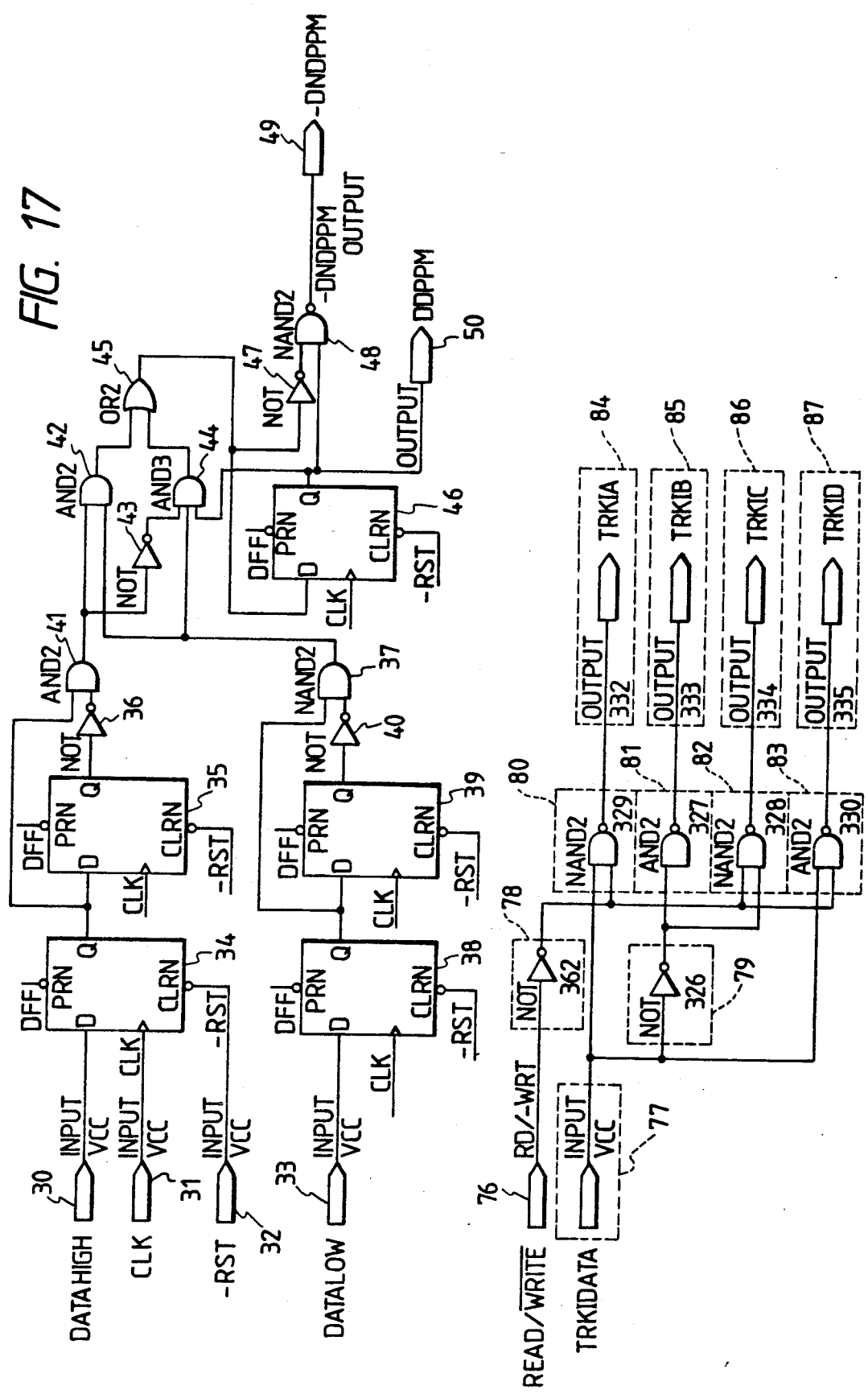
FIG. 17 is a circuit diagram showing the details of a logic circuit 29 shown in FIG. 16.
Figure 18:
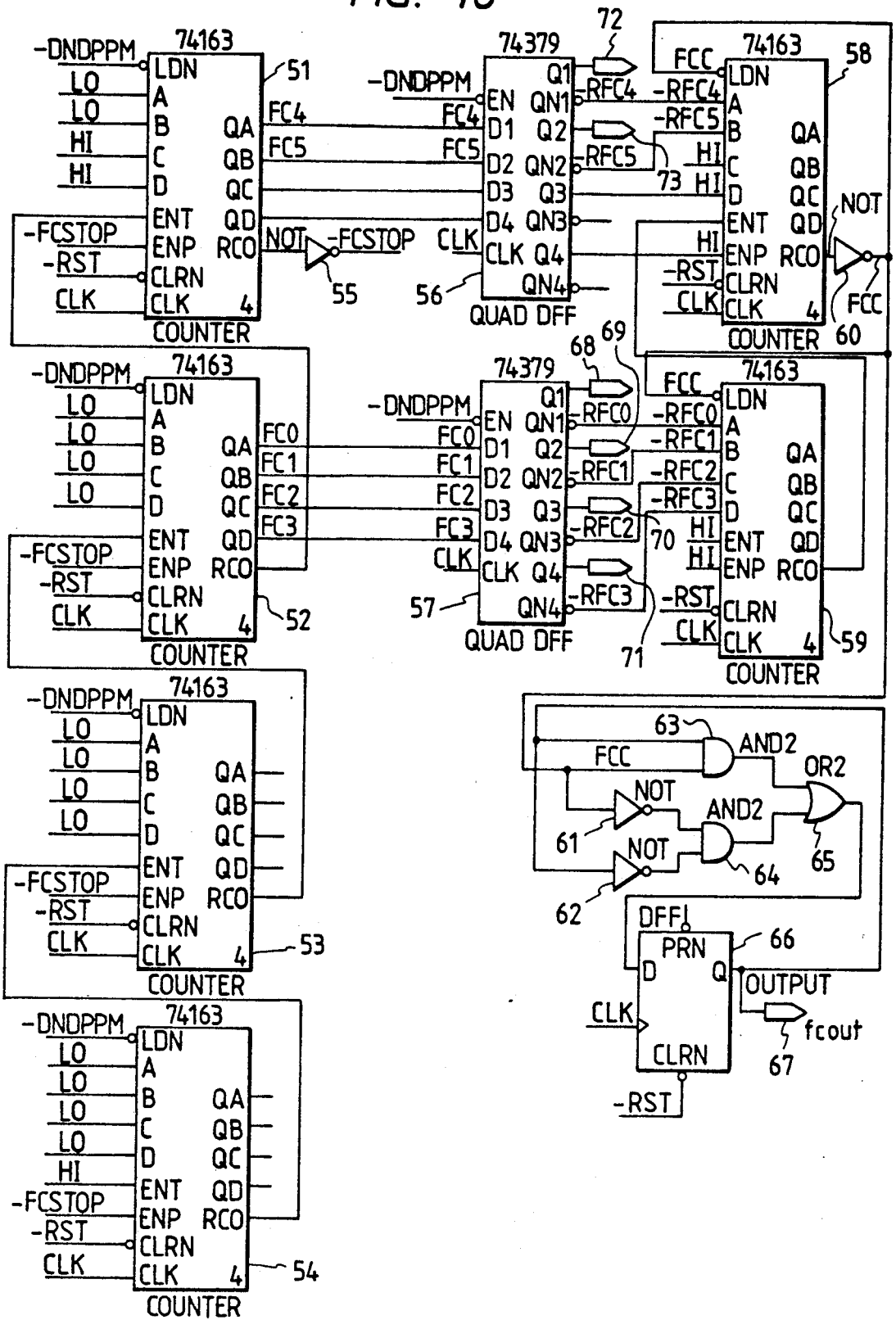
FIG. 18 is a circuit diagram showing the details of the logic circuit 29 shown in FIG. 16.

FIGS. 17 and 18 are circuit diagrams showing the details of the logic circuit 29 shown in FIG. 16. The logic circuit 29 comprises input terminals 30, 31, 32, 33, 76, and 77, D-flip-flops (DFFs) 34, 35, 38, 39, 46, and 66, NOT gates (NOTs) 36, 40, 43, 47, 55, 60, 61, 62, 78, and 79, NAND gates (NANDs) 37, 48, 80, and 82, AND gates (ANDs) 41, 42, 44, 63, 64, 81, and 83, OR gates (ORs) 45 and 65, output terminals 49, 50, 67, 68, 69, 70, 71, 72, 73, 74, 75, 84, 85, 86, and 87, 4-bit counters (e.g., SN74163 available from TI Corp.) 51, 52, 53, 54, 58, and 59, and 4-bit latches (e.g., SN74379 available from TI Corp.) 56 and 57.

In this embodiment, the clock signal interval having a predetermined positional interval of a pulse position (PPM) signal (FIG. 20) is measured by a 14-bit counter constituted by the 4-bit counters 51, 52, 53, and 54 (FIG. 18), and a filter clock signal according to the clock signal interval of the PPM signal is output. The switched capacitor filter circuit 25a is controlled in a frequency band matching with the PPM signal, and at the same time, the multiplier type D/A converter 25b controls to obtain a PPM signal having a predetermined amplitude. Note that the PPM signal is read out by the head H, and is recorded on the magnetic track of the film.

In this embodiment, the clock signal interval of the PPM signal is supplied to the control circuit 19. The control circuit 19 determines the write frequency and the write start timing, and executes a write operation.

The control circuit 19 stops the write operation in response to a detection signal of the perforation P2 from the photoreflector 7, decreases the feed speed of the film F, and stops the feed operation of the film F in response to a detection signal of the perforation P1.

The detailed description will be made below with reference to the above figures.

In FIG. 16, the output signal from the magnetic head H is amplified by the differential amplifier 24, and is input to the switched capacitor filter circuit 25a. The switched capacitor filter circuit 25a receives a filter clock according to the clock interval of the PPM signal from the logic circuit 29. The output from the switched capacitor filter circuit 25a is input to the multiplier type D/A converter 25b.

The logic circuit 29 controls the output from the multiplier type D/A converter 25b by a filter control latch signal. More specifically, the logic circuit 29 controls the output amplitude of the multiplier type D/A converter 25b in accordance with the clock signal interval of the PPM signal, so that the amplitude of the PPM signal becomes constant. The output from the multiplier type D/A converter 25b is input to the two comparators 27a and 27b. When the PPM signal becomes lower than the voltage value from the reference voltage source 28a, the comparator 27a outputs "1"; otherwise, it outputs "0".

When the PPM signal becomes higher than the voltage value from the reference voltage source 28b, the comparator 27b outputs "1"; otherwise, it outputs "0".

The logic circuit 29 receives the output from the comparator 27b at the input terminal 30, and receives the output from the comparator 27a at the input terminal 33 (FIG. 17). The logic circuit 29 receives an output from an oscillation circuit (not shown) at the input terminal 31 as a system clock, and as is apparent from FIG. 20, input signals are not simultaneously applied to the input terminals 30 and 33.

Figure 20:
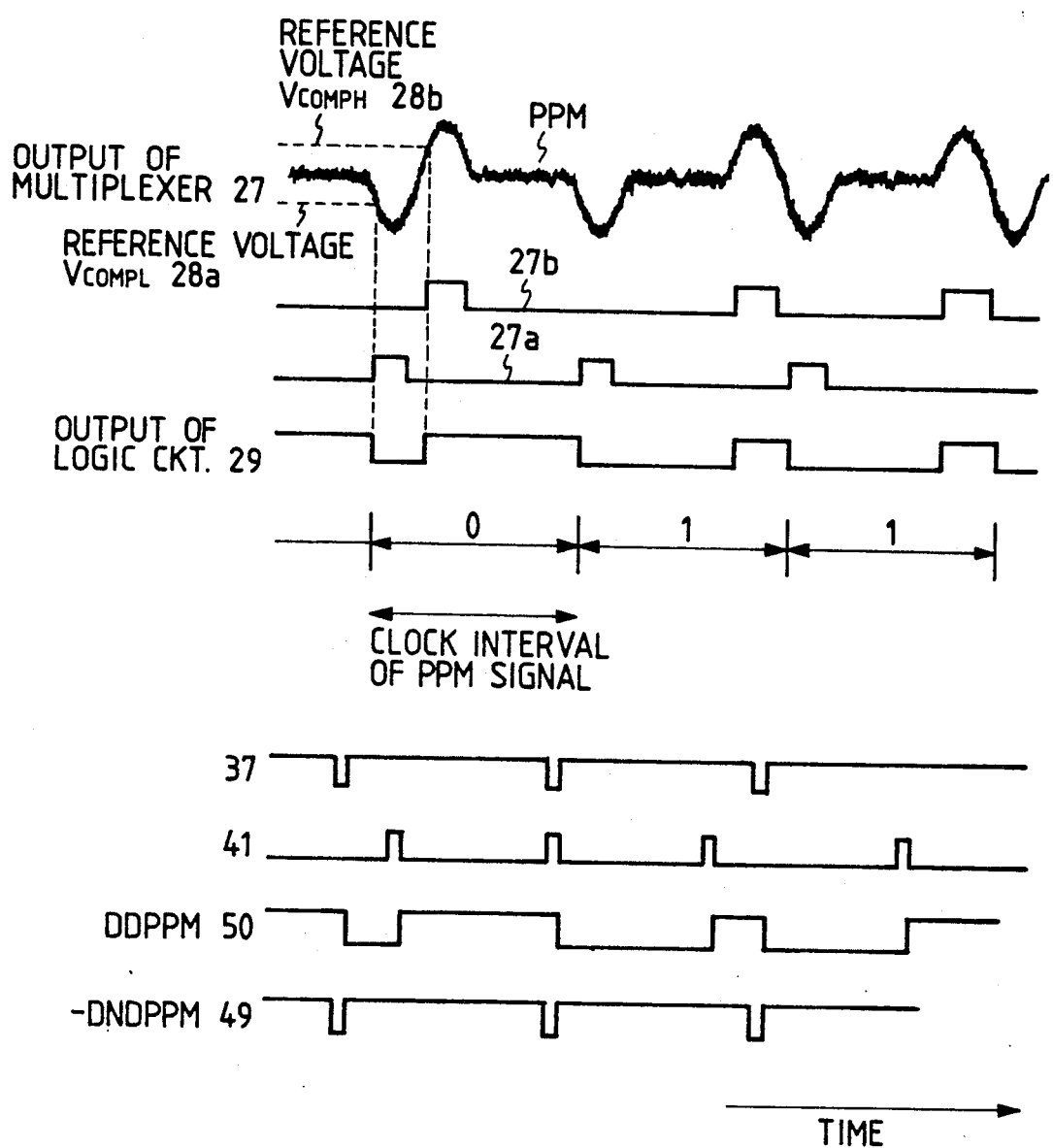
FIG. 20 is a chart for explaining a pulse position signal.

In the above arrangement, the outputs from the comparators 27a and 27b are as shown in FIG. 20. That is, the comparator 27a detects the trailing edge timing of the PPM signal, and the comparator 27b detects the leading edge timing of the PPM signal. Note that one cycle of the PPM signal is defined between a given falling signal and the next falling signal. The signal of one cycle is recorded in a predetermined length of the track.

In FIG. 17, when the output from the comparator 27a changes from "0" to "1", and the output from the NAND2 37 goes to logic "0" for one clock, the output from the DFF 46 changes from "1" to "0". The NAND2 48 outputs "0" for one clock. More specifically, every time the output from the comparator 27a rises, an output DDPPM at the terminal 50 is inverted from "1" to "0", and an output −DNDPPM at the terminal 49 goes to logic "0" for one clock.

When the output from the comparator 27b changes from "0" to "1", the AND 41 outputs "1" for one clock. The output from the DFF 46 is inverted from "0" to "1" in response to "1" for one clock from the AND2 41. More specifically, every time the output from the comparator 27b rises, the output DDPPM at the terminal 50 is inverted from "0" to "1". The above-mentioned relationship is as shown in FIG. 20. The output DDPPM at the terminal 50 becomes a signal having a duty ratio according to the timings of the falling and rising signals within one cycle of the PPM signal, and the output −DNDPPM at the terminal 49 outputs a negative pulse (0) every time the cycle of the PPM signal starts. Since the PPM signal is read out by the head during the film feed operation, the interval of the −DNDPPM signal indicates a value according to the film feed speed.

The 14-bit counter (PPM cycle counter) constituted by the 4-bit up counters 51, 52, 53, and 54 in FIG. 18 loads input data when the −DNDPPM signal goes to logic "0". In this case, the input data is C000H in hexadecimal notation. If the frequency of the system clock is 8 MHz, the carry output (RCO) from the 4-bit counter 51 goes to logic "1" after an elapse of 2.048 ms from the beginning of the count-up operation.

When the −DNDPPM signal goes to logic "0", a 6-bit latch filter control latch constituted by the 4-bit latches 56 and 57 latches the upper 6 bits of the output from the 14-bit counter. In this arrangement, every time the cycle of the PPM signal is started, the 14-bit counter loads C000H as initial data, and the latches 56 and 57 latch the upper 6 bits of the output from the 14-bit counter.

The cycle interval of the PPM signal is counted by the 14-bit counter, and the upper 6 bits of the count value are used as a count value.

The count value from the output terminals 68, 69, 70, 71, 72, and 73 of the latches is output to the multiplier type D/A converter 25b, and the gain of the multiplier type D/A converter 25b is changed according to the input count value, i.e., the cycle interval of the PPM signal.

Every time a 6-bit counter (filter clock counter) constituted by the 4-bit counters 58 and 59 outputs a carry signal in its count-up operation, it loads a negative output from the 6-bit latch (56, 57). Therefore, the output interval of the carry signal changes according to the cycle interval of the PPM signal.

The DFF 66 inverts its output every time the carry signal from the 4-bit counter 58 goes to logic "1". The output from the DFF 66 is output as a filter clock to the switched capacitor filter circuit 25a.

In this embodiment, the cycle interval of the PPM signal/filter clock interval=128.

Figure 19:
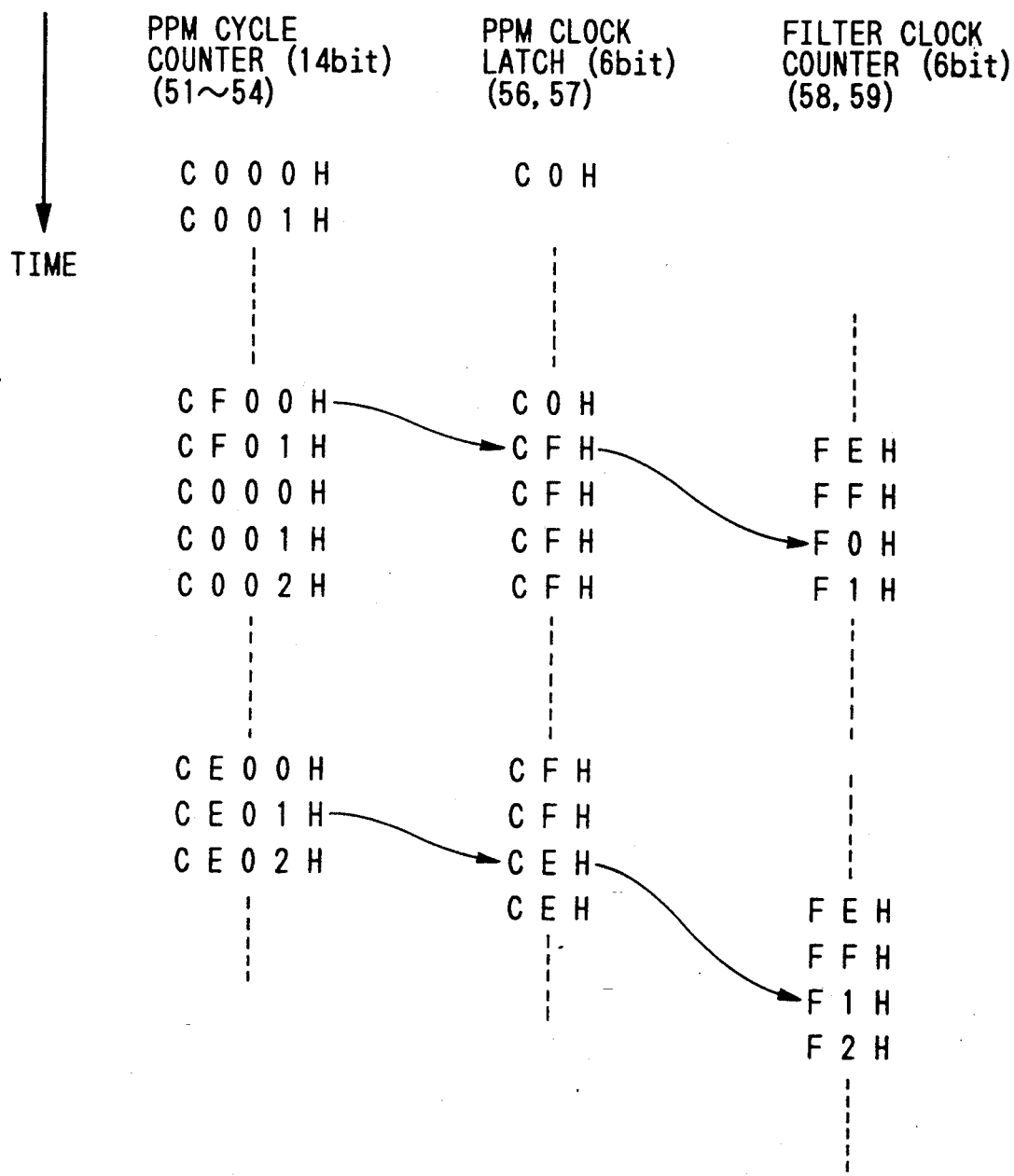
FIG. 19 is a view for explaining the operation of the logic circuit 29 shown in FIG. 16.

FIG. 19 shows the relationship between these counters and latches.

When the −DNDPPM signal goes to logic "0" when the count value of the PPM cycle counter is CF00H, the filter control latch latches CFH. After several system clocks, when the carry signal from the filter clock counter goes to logic "1", and the counter loads the negative output from the filter control latch, it loads F0H, and continues a count-up operation. Thereafter, every time the carry signal goes to logic "1", the counter loads F0H.

When the −DNDPPM signal goes to logic "0" when the count value of the PPM cycle counter is CE01+1. the filter control latch latches CEH. Thereafter, the filter clock counter loads F1H every time the carry signal goes to logic "1".

In the above arrangement, since the −DNDPPM signal goes to logic "0" every time the cycle of the PPM signal is started, when the interval of the PPM signal is long, i.e., when the film feed speed is low, the count value of the cycle counter (51 to 54) becomes large. Thus, a value latched by the latch (56, 57) also becomes large. Therefore, the initial count value loaded by the counter (58, 59) becomes small, and a time interval from the initial value until the carry output (RCO terminal) is generated is prolonged. In the above-mentioned case, the interval of the DFF 66 is also prolonged. Since the output from the DFF 66 is input to the filter 25a as a filter clock, a filter clock having a longer interval as the feed speed is lower is input.

The filter 25a switches its frequency characteristics so as to have a cut-off frequency proportional to the output interval of the DFF 66. Thus, as the feed speed is lower, the cut-off frequency is set to be lower.

Figure 21:
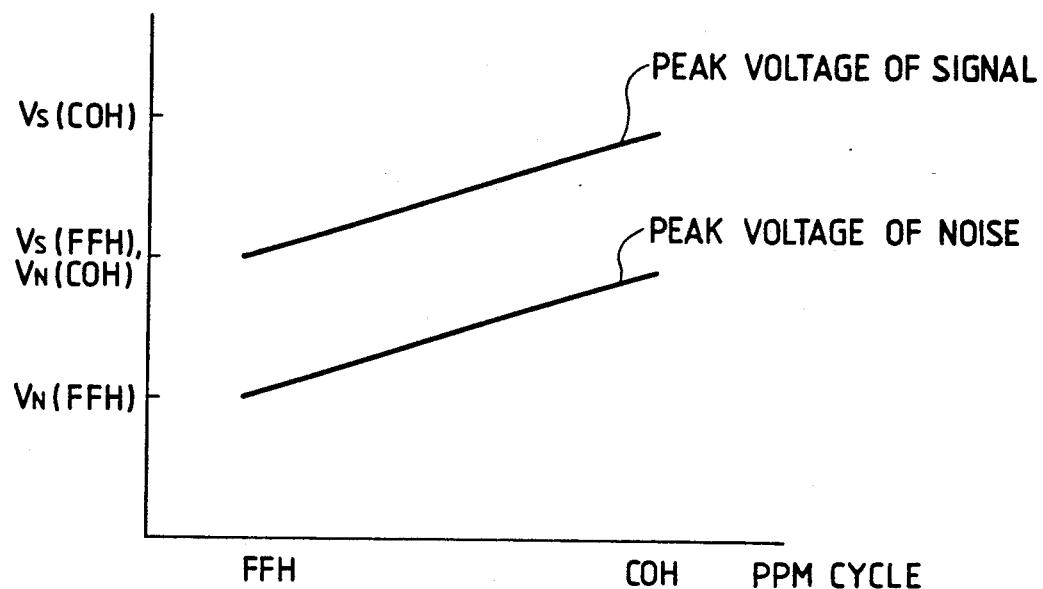
FIG. 21 is a graph showing the relationship between the frequency and the amplitude of a pulse position signal.

FIG. 21 shows the relationship between the output voltage from the switched capacitor filter circuit 25a and the cycle interval of the PPM signal.

The amplitude of the signal output from the magnetic head H is proportional to the film feed speed. A noise voltage is also proportional to the cycle interval since the filter clock (frequency characteristics) of the switched capacitor filter circuit 25a is changed by the logic circuit 29.

Figure 22:
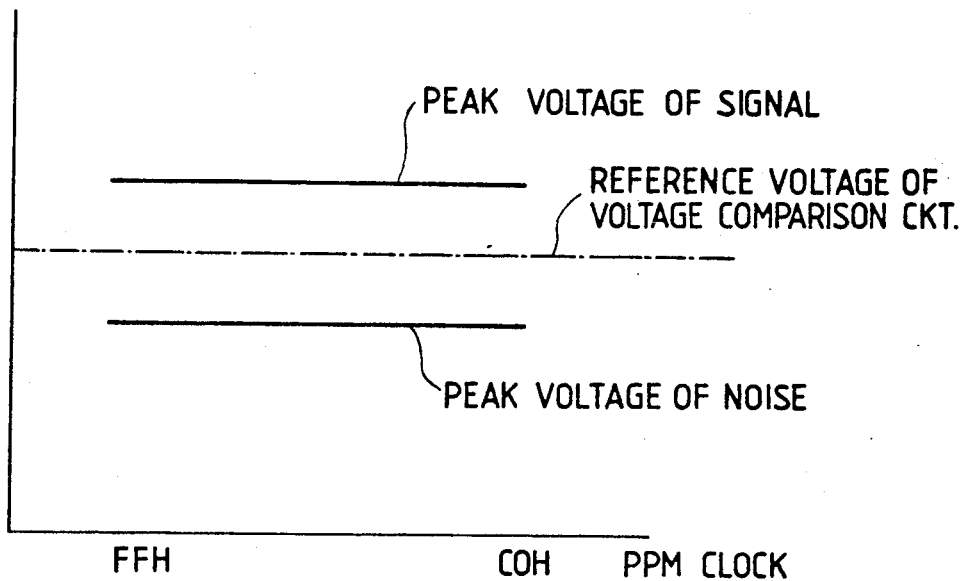
FIG. 22 is a graph showing the relationship between the frequency and the amplitude of a pulse position signal.

When the gain is set to be constant when the output level of the multiplier type D/A converter 25b is FFH and C0H, the output amplitude of the multiplier type D/A converter 25b becomes constant regardless of the cycle interval of the PPM signal, as shown in FIG. 22. Therefore, when the reference voltages for the comparators 27a and 27b are set to be constant, magnetic data information can be precisely reproduced regardless of the cycle interval of the PPM signal.

The operation of the control circuit 19 will be described below with reference to the flow chart of FIG. 23.

It is checked if the film cartridge C is loaded in the camera, a back lid is closed, and a back lid switch (not shown) is turned on (step 201; to be abbreviated to as S201 hereinafter). If Y (YES) in S201, the flow advances to S202. The film feed motor 8 is driven through the motor driver 22 to start a winding (auto-loading) operation of the film F (S202). During the film winding operation, information associated with the film such as a film sensitivity, the number of frames, a film type, and the like, written in advance in the magnetic recording portion T of the film F is read out by the magnetic head H (S203). The readout information is converted into a digital signal by the read/write circuit 23, as described above, and is stored in the RAM 21.

The number of fed frames is counted based on the output from the photoreflector 7 according to the film winding operation, and it is checked if the first frame has reached a predetermined position (aperture position) (S204). If Y in S204, the flow advances to S205. The driving operation of the film feed motor 8 is stopped to stop the film winding operation (S205).

It is then checked if the switch SW1 is ON (S206). If Y in S206, the flow advances to S207. The photometry sensor 4 and the distance measuring sensor 6a are driven to obtain photometry information and distance measuring (object distance) information (S207). Furthermore, it is checked if the switch SW2 is ON (S208). If Y in S208, the flow advances to S209, and a known exposure operation is performed (S209).

More specifically, in S209, the control circuit 19 receives a lens position signal from a lens encoder 2b through a lens actuator 2a, and issues a stop instruction to the lens actuator 2a when the photographing lens 1 reaches a position corresponding to the object distance data obtained in S207, thereby stopping the driving operation of the photographing lens 1, i.e., the focusing operation. At substantially the same time, in S209, the control circuit 19 performs an opening/closing operation of the shutter 3 during a time interval determined by the output from the photometry sensor 4. At this time, the shutter speed and aperture value are stored in the RAM 21.

In this case, a photographing operation is performed on the first photographing frame (Aa). However, for the sake of convenience for the following description, it is assumed that a photographing operation is performed on the photographing frame Ab in FIG. 14.

Thereafter, the film feed motor 8 is driven through the motor driver 22 to start the winding operation of the photographing frame Ab (one-frame winding operation). Thus, the film F is fed in the direction of the arrow X (S210).

During the feed operation of the film F, information written in advance in the magnetic recording portion T of the film F is read by the magnetic head H. The number of the above-mentioned −DNDPPM signals generated for each bit of the information on the magnetic recording portion T is counted, and it is checked if the number of −DNDPPM signals is equal to or smaller than PPMN as a predetermined value (S211). This starts a write operation from a position determined by the value PPMN even when the feed speed of the film F is not constant.

Then, a filter control latch RFC signal (the count value of the latches 56 and 57 (FIG. 18)) is stored in response to each −DNDPPM signal generated for each bit (one cycle of the PPM signal) of the information on the magnetic recording portion T, and is compared with a previous filter control latch RFC signal (the count value of the latches 56 and 57 (FIG. 18)) (S212), thereby detecting that the feed speed of the film F has become constant (see regions α and β of FIG. 15).

After the film feed speed becomes constant, the information write frequency by the magnetic head H is determined by a calculation or with reference to a table on the basis of the filter control latch RFC signal (the frequency is lowered as the count value of the latches 56 and 57 is larger) (S213). When the film feed speed is low, the write frequency is decreased; otherwise, the write frequency is increased, so that the number of bits written per unit distance becomes constant.

A Read/-Write signal is set to be "0" to drive the magnetic head H, thereby starting the write operation of various data such as the shutter speed, the aperture value, and the like through the constant current circuit 26 (on the region Sb) (S214).

It is then checked if the perforation P2 provided in correspondence with the photographing frame Ab has passed the position of the photoreflector 7 (S215). If N (NO) in S215, the flow returns to S214 to continue the information write operation. Thereafter, if it is determined that the perforation P2 has passed the position of the photoreflector (PR) 7, the flow advances to S216. The driving operation of the magnetic head H is immediately stopped to stop the information write operation (S216). Thus, the information can be precisely written within the region Sb (without entering another photographing frame). Since original information remains on a portion other than the region Sb, when the film cartridge C is unloaded from the camera, and is loaded again, a photographed frame or a non-photographed frame can easily discriminated.

At the same time, the energizing state to the film feed motor 8 is changed through the motor driver 22. More specifically, the film feed speed is lowered by changing the duty or decreasing the voltage, thus preparing for a stop state (a region γ in FIG. 15).

It is then checked if the perforation P1 provided in correspondence with the photographing frame Ac has passed the position of the photoreflector 7 (S217). If Y in S217, the flow advances to S218. The driving operation of the film feed motor 8 is stopped through the motor driver 22 to stop the winding operation of the film F (S218). In this case, the film feed operation cannot be immediately stopped, and the film F is slightly fed to a region δ in FIG. 15. This distance is L1. Thus, the photographing frame Ac reaches the aperture position.

It is checked based on the number of frames (read out in S203) in S219 if the film F has non-photographed frames (remaining frames). If Y in S219, the flow returns to S206. However, if N in S219, the flow advances to S220. The film feed motor 8 is driven through the motor driver 22 to rewind the film F.

As described above, a series of operations are completed.

Although not described above, the pad 11 is pressed against the magnetic head H by the pad forward/backward movement mechanism 12 during only movement of the film F to assure read/write operations of magnetic information.

According to this embodiment, the information write frequency and information write start timing of the magnetic head H are determined using the output signal from the magnetic head H. Using the output signal from the photoreflector 7, the information write stop timing is determined, and stop control of the one-frame feed operation of the film F is made. For this reason, a mechanical member such as an encoder can be omitted, thus providing advantages in terms of space and cost. Thus, the film F can be prevented from being damaged by, e.g., dust.

Figure 24:
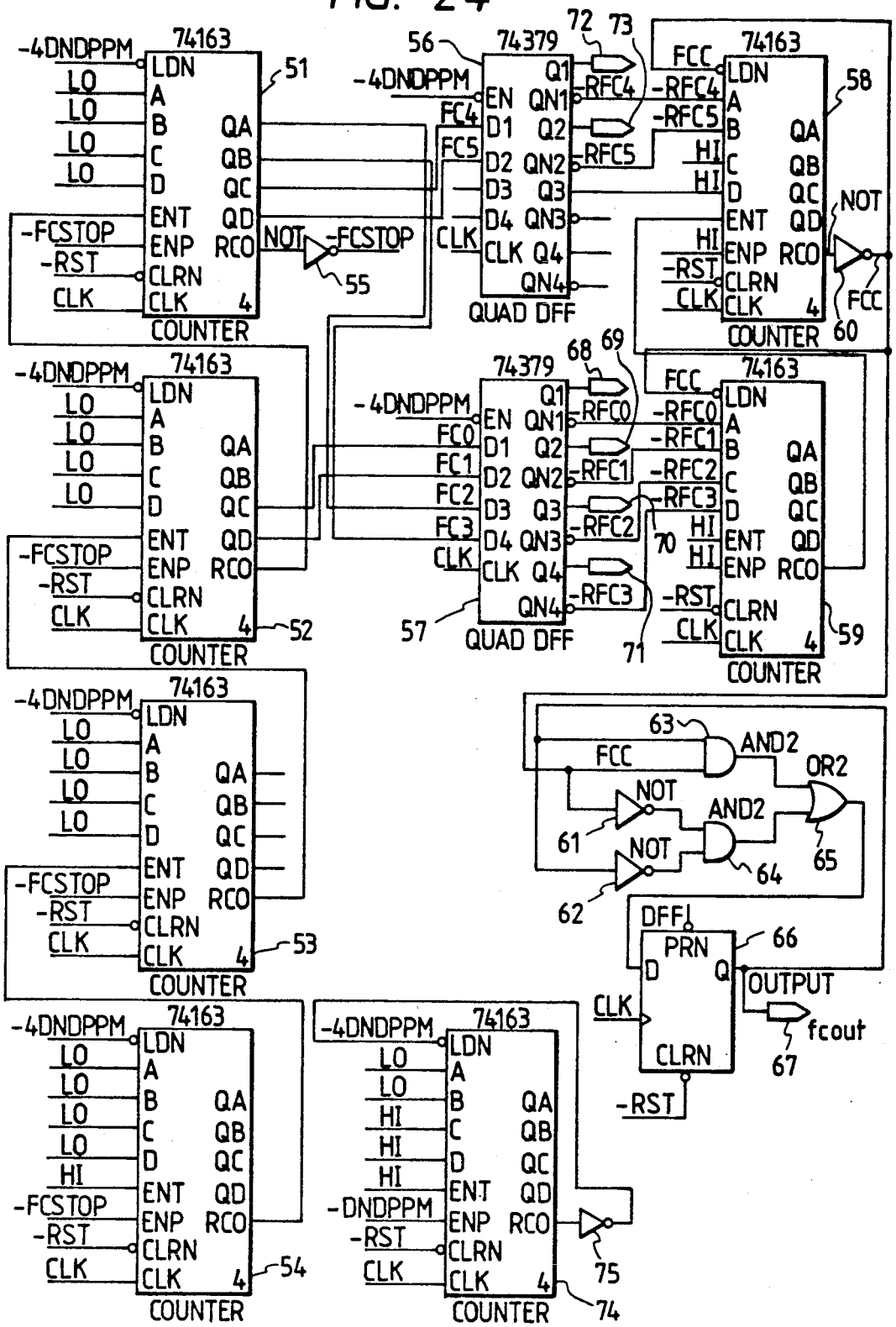
FIG. 24 is a circuit diagram showing a logic circuit according to the fifth embodiment of the present invention.

FIG. 24 is a circuit diagram showing the details of a logic circuit according to the fifth embodiment of the present invention, and corresponds to FIG. 18.

A 16-bit PPM cycle counter is constituted by 4-bit counters 51, 52, 53, and 54. The clock interval of a PPM signal can be counted longer by 2 bits (four times) than the counter shown in FIG. 18.

A 4-bit counter 74 is arranged to perform a 2-bit count operation. When a −DNDPPM signal goes to logic "0" four times, the counter 74 sets a −4DNDPPM signal at logic "0" once. Therefore, the 16-bit PPM counter counts an interval corresponding to four cycles of the PPM signal, and a PPM clock latch also latches the interval corresponding to the four cycles of the PPM signal as 6-bit data.

With the above-mentioned arrangement, a filter clock interval can be generated based on an average interval of the four cycles of the PPM signal as compared to the embodiment shown in FIG. 18. For example, even when the jitter of the film feed operation is large, a filter control latch RFC signal can be stably generated.

Figure 25:
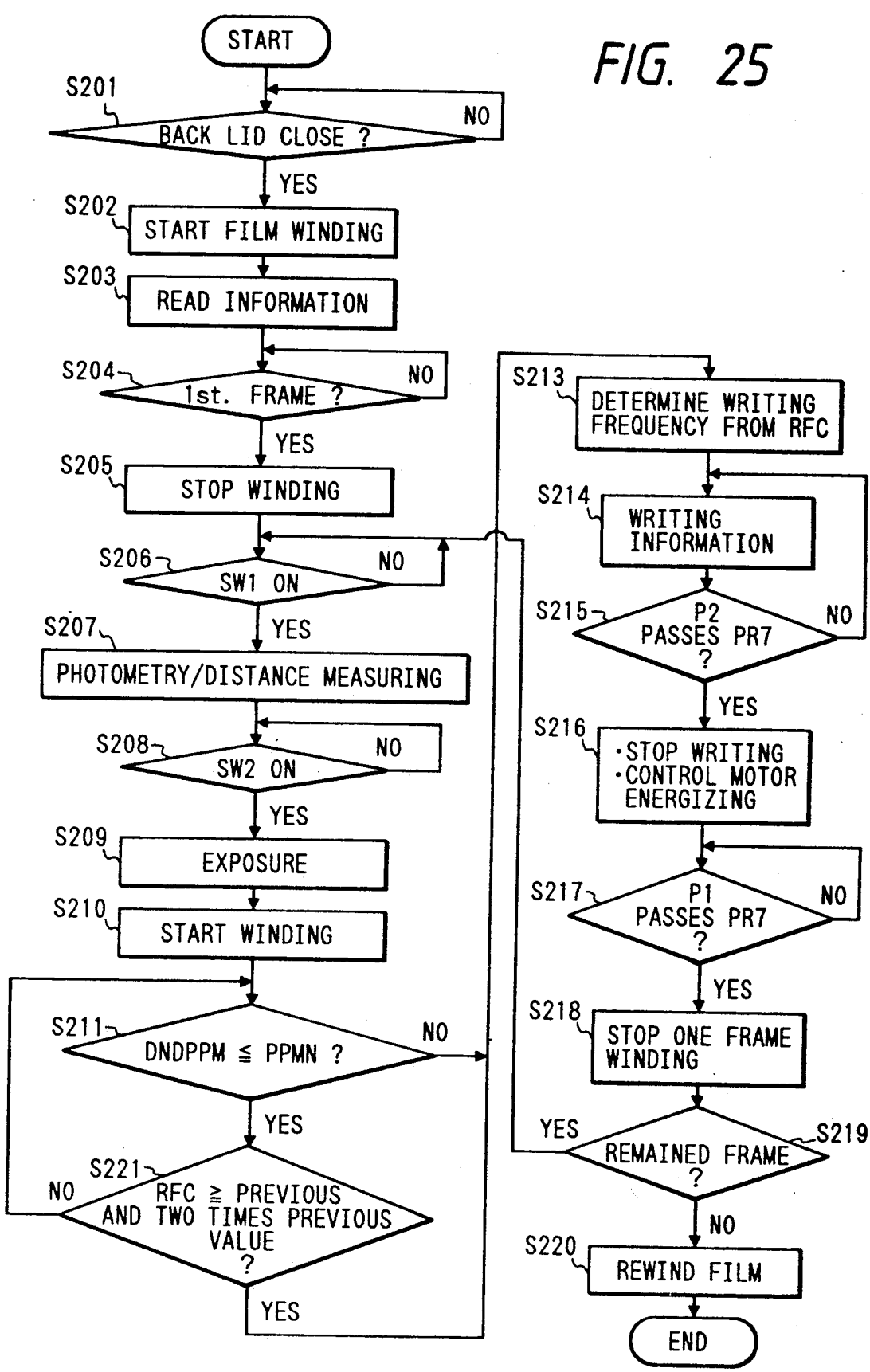
FIG. 25 is a flow chart showing the operation of the embodiment shown in FIG. 24.

FIG. 25 is a flow chart for explaining an operation of the embodiment shown in FIG. 24. In comparison with the flow chart shown in FIG. 23, "S212" is changed to "S221". More specifically, a filter control latch RFC signal is stored in response to a −DNDPPM signal generated for each bit of information on the magnetic recording portion T, and is compared with the last two filter control latch RFC signals, thereby detecting that the feed speed of the film F has become constant (see regions α and β of FIG. 15).

In this embodiment, as compared to "S212", since the filter control latch RFC signal is compared with the last two signals, even when the speed nonuniformity (jitter) upon feeding of the film F is large, it can be reliably detected that the feed speed has become constant.

Figure 26:
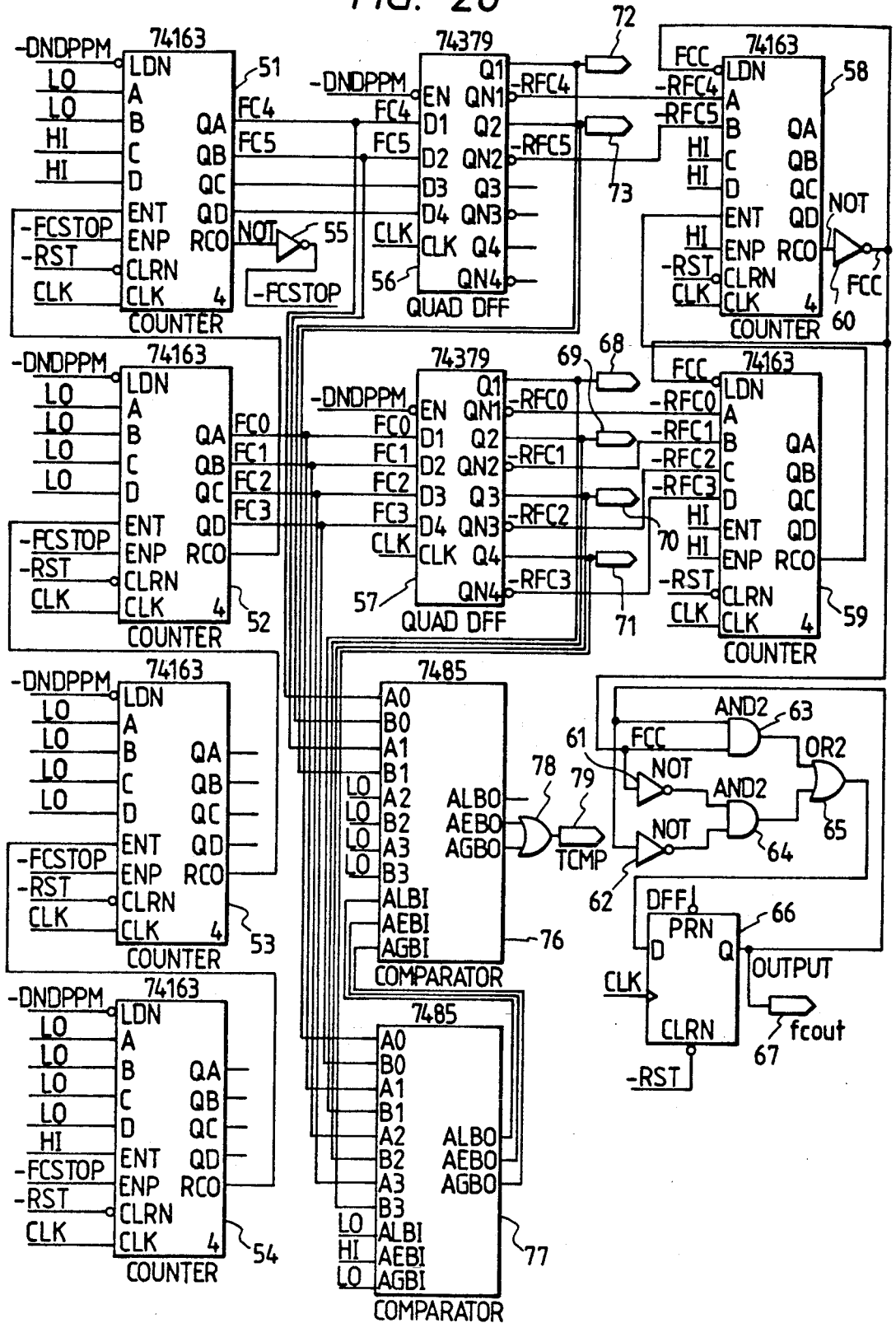
FIG. 26 is a circuit diagram showing a logic circuit according to the sixth embodiment of the present invention.
Figure 27:
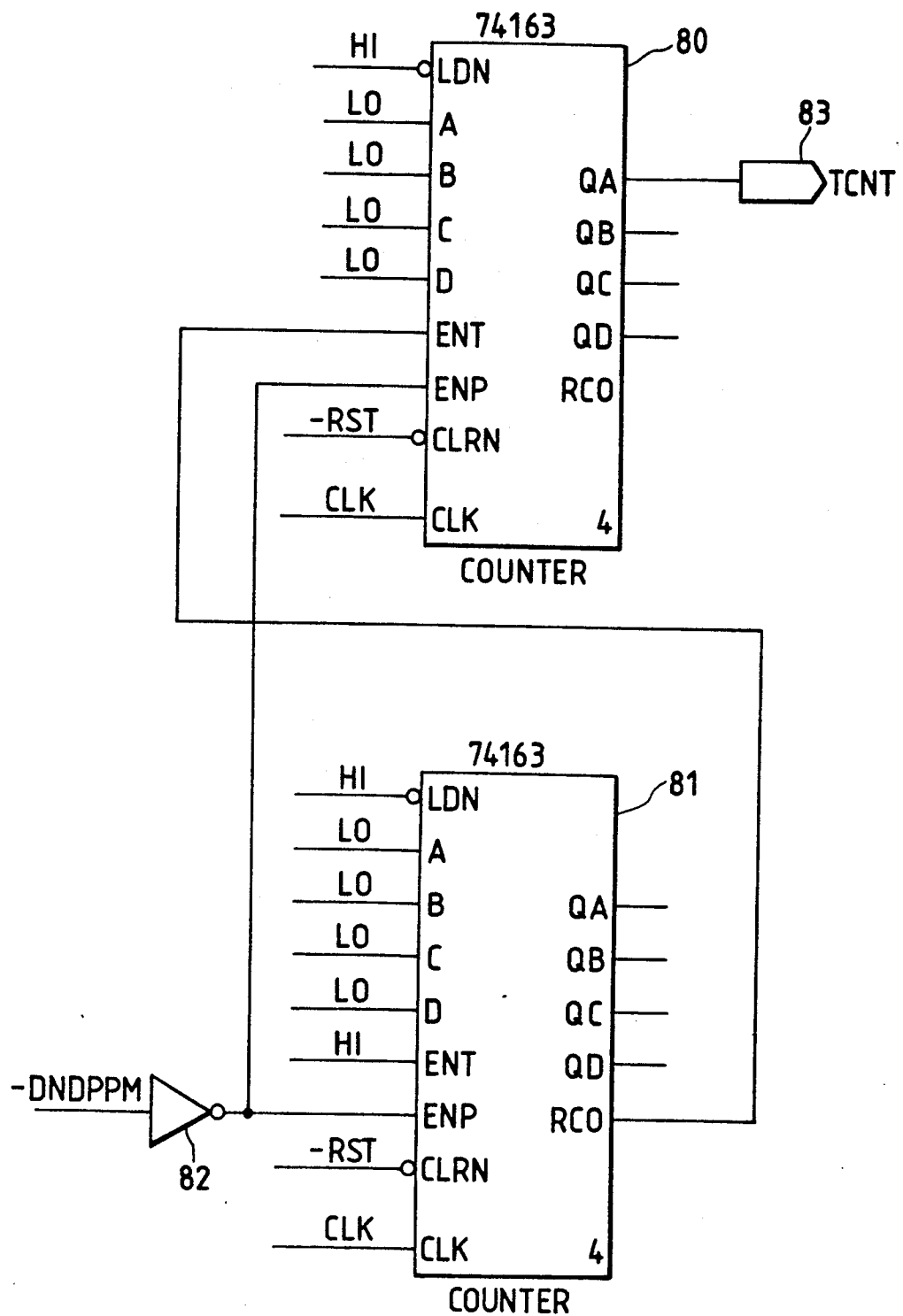
FIG. 27 is a circuit diagram showing the logic circuit according to the sixth embodiment of the present invention.
Figure 28:
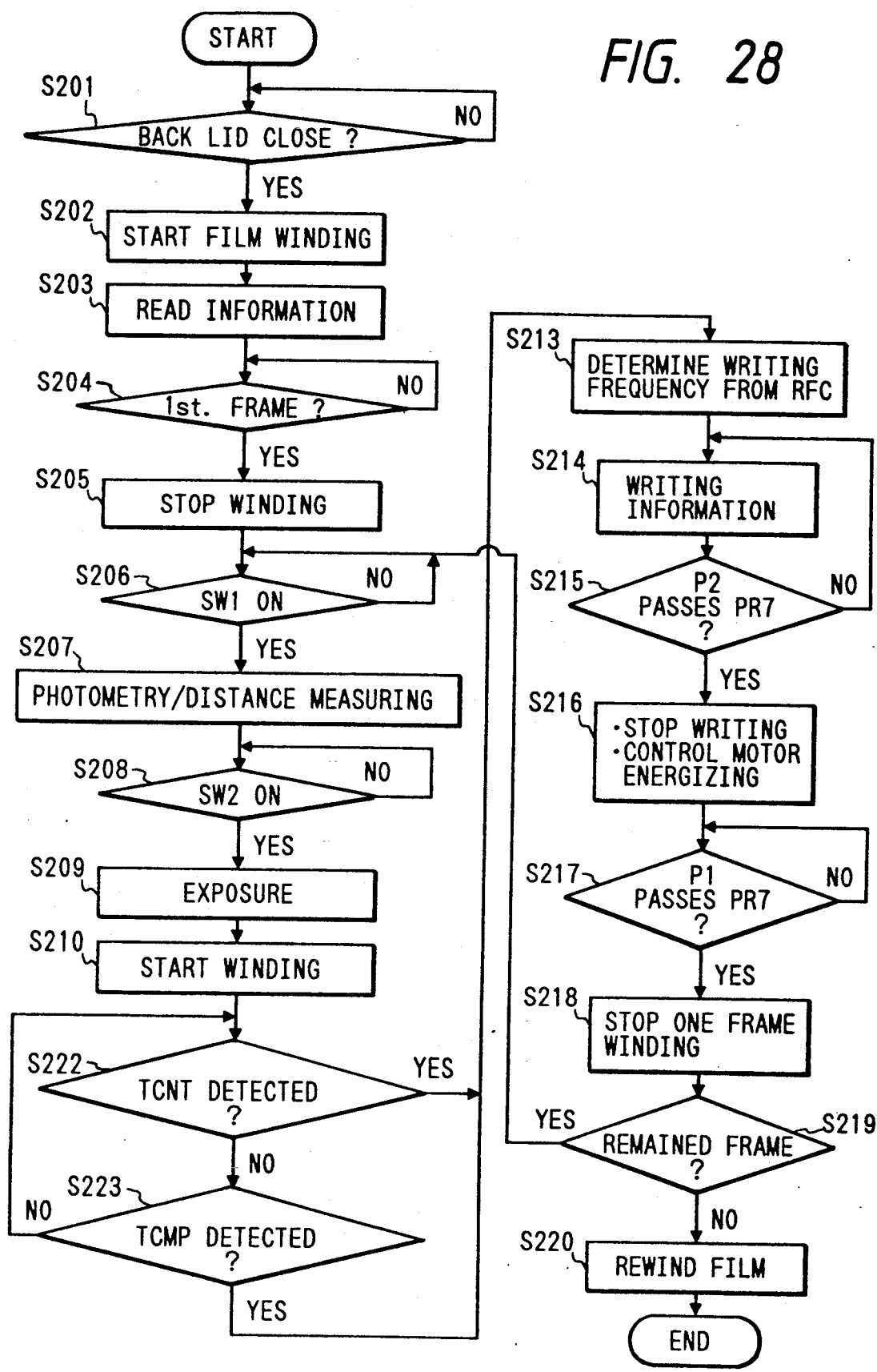
FIG. 28 is a flow chart for explaining the operation of the embodiment shown in FIGS. 26 and 27.

FIGS. 26, 27, and 28 show the sixth embodiment of the present invention. FIGS. 26 and 27 correspond to FIG. 18, and detection operations executed in "S211" and "S212" are realized by a hardware arrangement.

A circuit shown in FIG. 26 includes 4-bit comparators 76 and 77, an OR gate 78, and an output terminal 79. A circuit shown in FIG. 27 includes 4-bit counters 80 and 81, a NOT gate 82, and an output terminal 83.

In the above arrangement, the 4-bit comparators 76 and 77 compare the immediately preceding and current filter control latch RFC signals. When the current signal is equal to or larger than the immediately preceding signal, an output signal TCMP is set to be "1".

The control circuit 19 detects the signal TCMP in synchronism with a DNDPPM signal.

The 4-bit counters 80 and 81 count that a −DNDPPM signal has been generated 32 times, and inform this to the control circuit 19 by a TCNT signal. Thus, the write operation can be started 32 bits of information after the feed operation of the film F.

Figure 23:
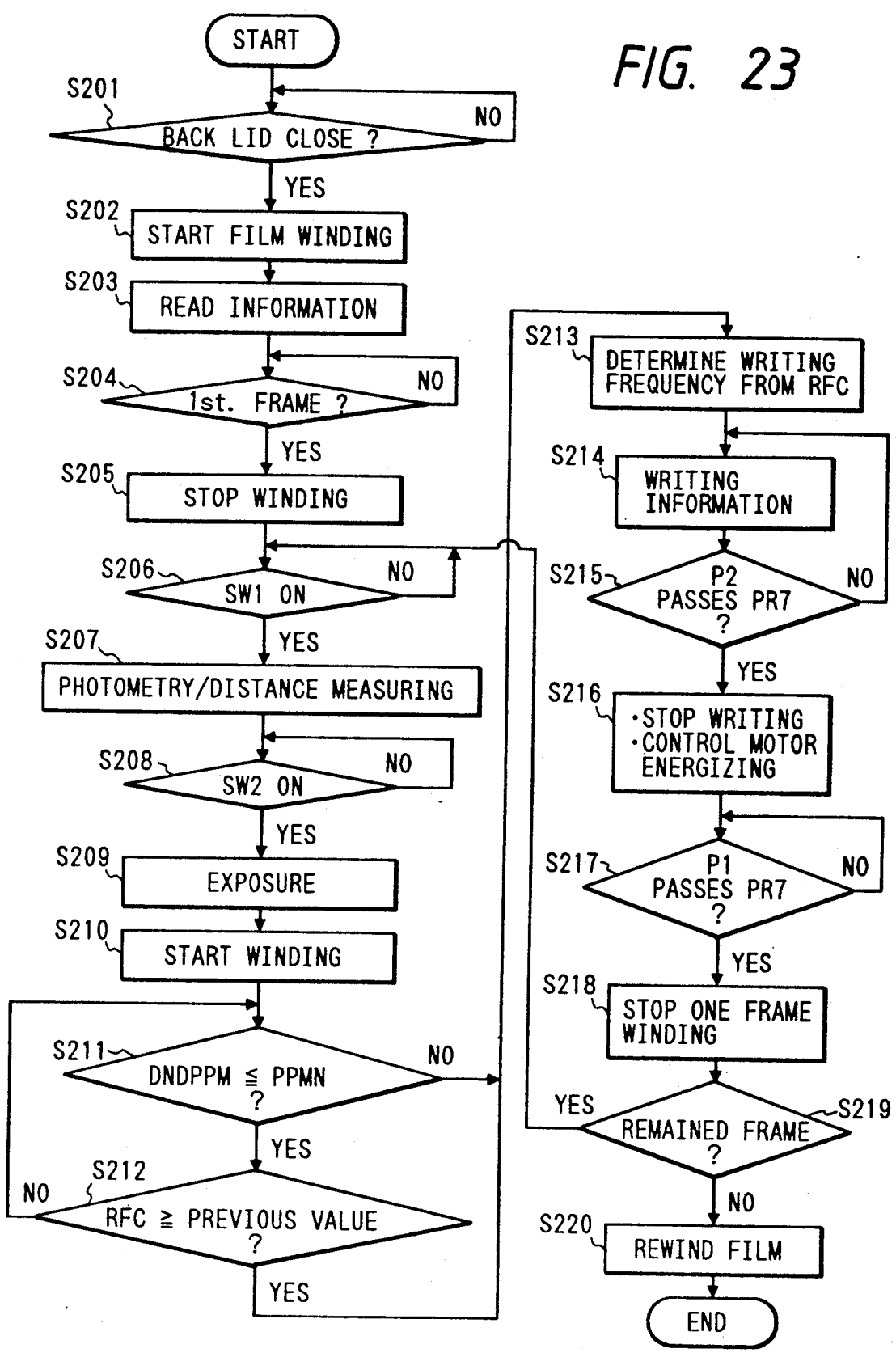
FIG. 23 is a flow chart for explaining the operation of the block diagram of FIG. 13.

FIG. 28 is a flow chart for explaining the operations in FIGS. 26 and 27, and corresponds to FIG. 23. A difference from FIG. 23 is that "S211" and "S212" are replaced with "S222" and "S223", respectively.

In "S222", the TCNT signal is detected in synchronism with the −DNDPPM signal. When the TCNT signal is "1", the flow advances to "S213"; when it is "0", the flow advances to "S222". Thus, the write operation is started 32 bits of information recorded on the film F after the film feed operation is started.

In "S223", the TCMP signal is detected in synchronism with the −DNDPPM signal. When the TCMP signal is "1", the flow advances to "S213"; when it is "0", the flow advances to "S222". Thus, it can be detected that the current filter control RFC signal is equal to or larger than the immediately preceding signal (the film feed speed remains the same or is decreased).

FIGS. 30 to 34 show a circuit for reproducing information recorded on a magnetic recording portion of a film according to the seventh embodiment of the present invention.

Figure 30:
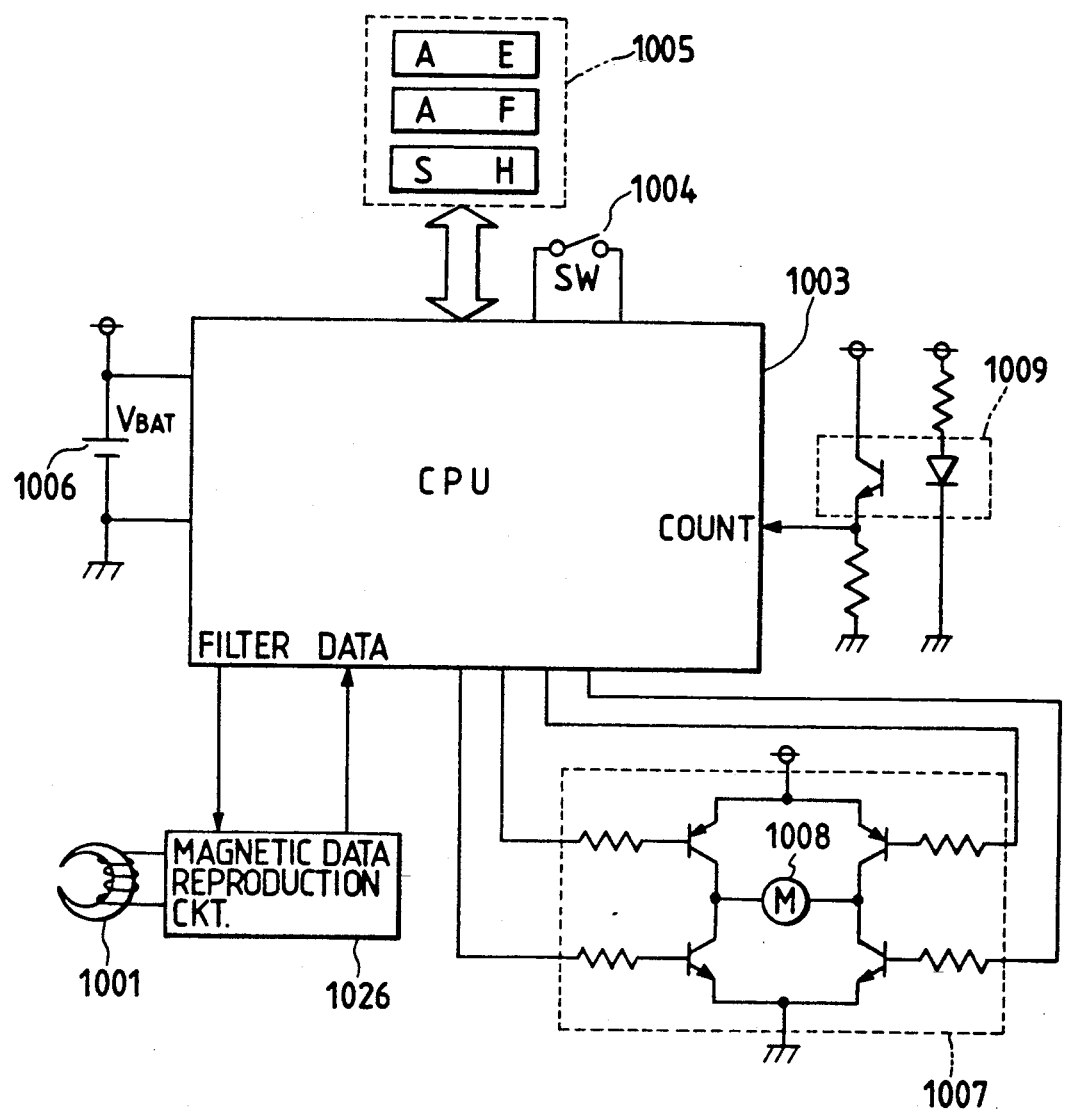
FIG. 30 is a block diagram of a conventional camera.

FIG. 30 is a block diagram showing an electrical circuit of a conventional camera.

The circuit shown in FIG. 30 includes a magnetic head 1001, a microcomputer 1003, a switch 1004, a control circuit 1005 for performing photometry (AE), distance measuring (AF), and shutter driving (SH) operations, a battery 1006, a film feed motor driving circuit 1007, a film feed motor 1008, a film perforation detection photoreflector 1009, and a magnetic data reproduction circuit 1026.

Figure 31:
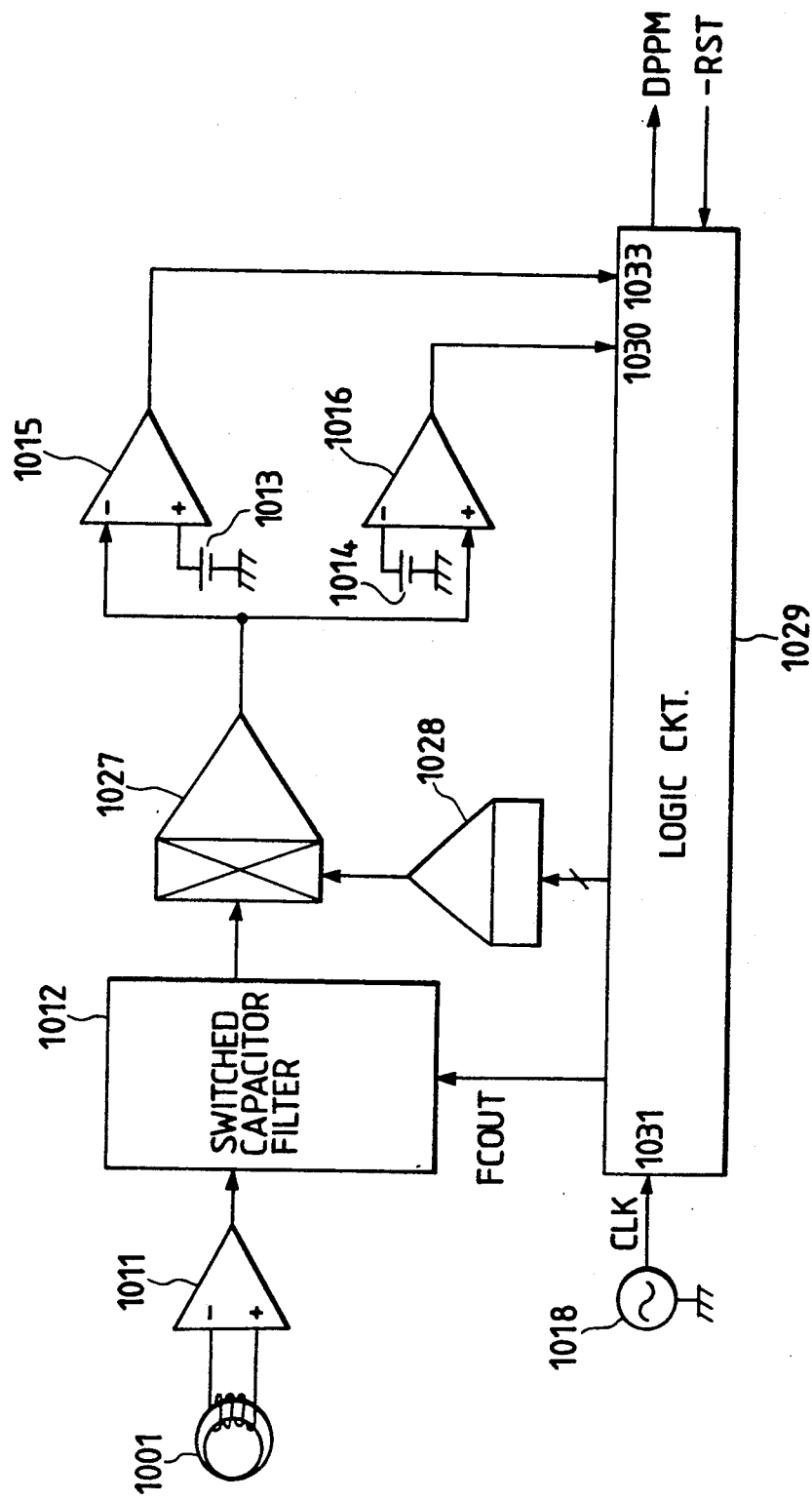
FIG. 31 is a circuit diagram showing the details of a magnetic data reproduction circuit 26 shown in FIG. 30.

FIG. 31 is a circuit diagram showing the details of the magnetic data reproduction circuit 1026 shown in FIG. 30. The reproduction circuit 1026 includes a differential amplifier (e.g., AD524 available from Analog Devices Corp.) 1011, a switched capacitor filter (e.g., LTC1064-3 available from Linear Technology Corp.) 1012, reference voltage sources 1013 and 1014, voltage comparison circuits (e.g., LM2903 available from TI Corp.) 1015 and 1016, an oscillation circuit 1018, a multiplexer (e.g., AD534 available from Analog Devices Corp.) 1027, a D/A converter 1028, and a logic circuit 1029.

Figure 32:
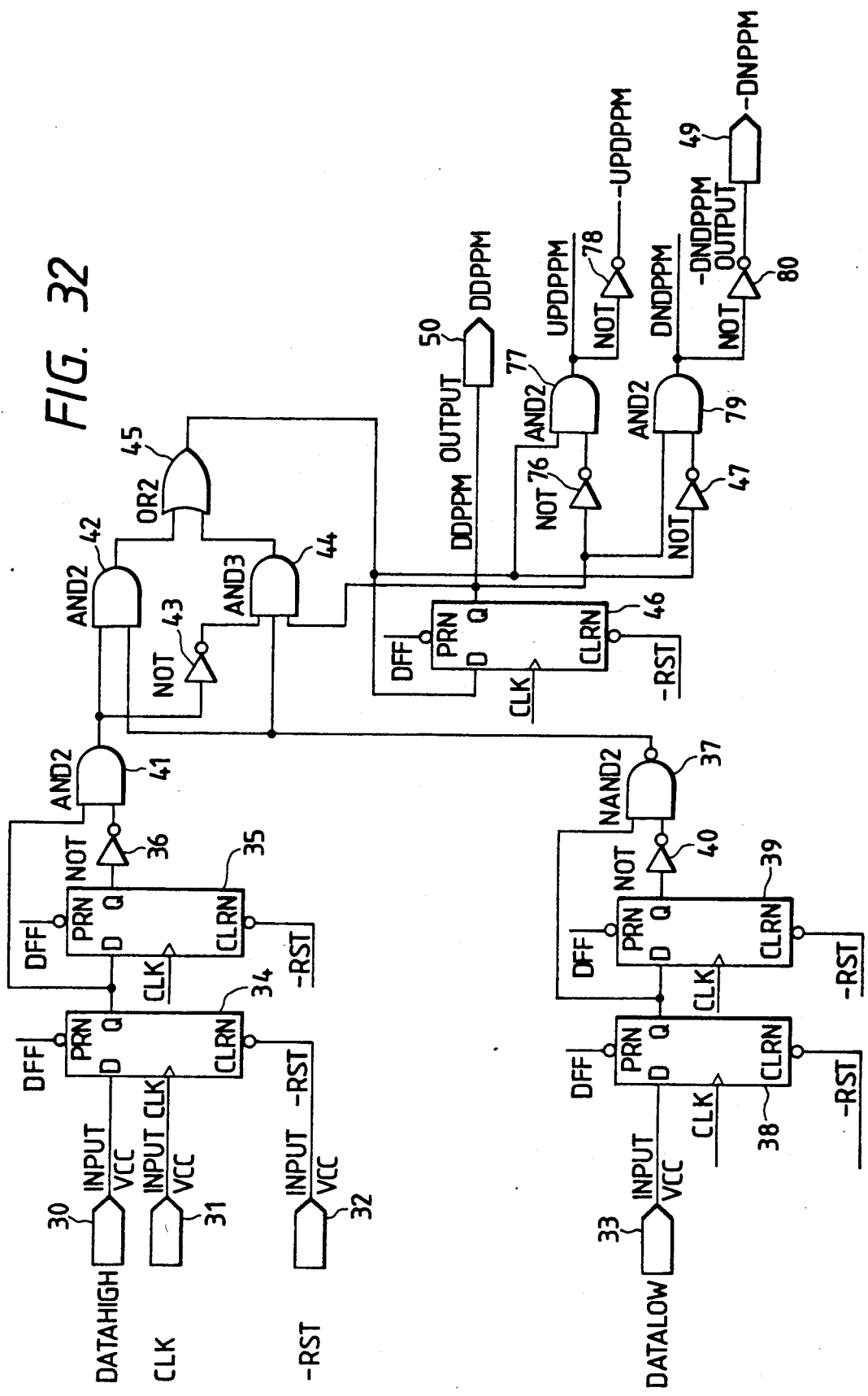
FIG. 32 is a circuit diagram showing the details of a logic circuit shown in FIG. 31.
Figure 33:
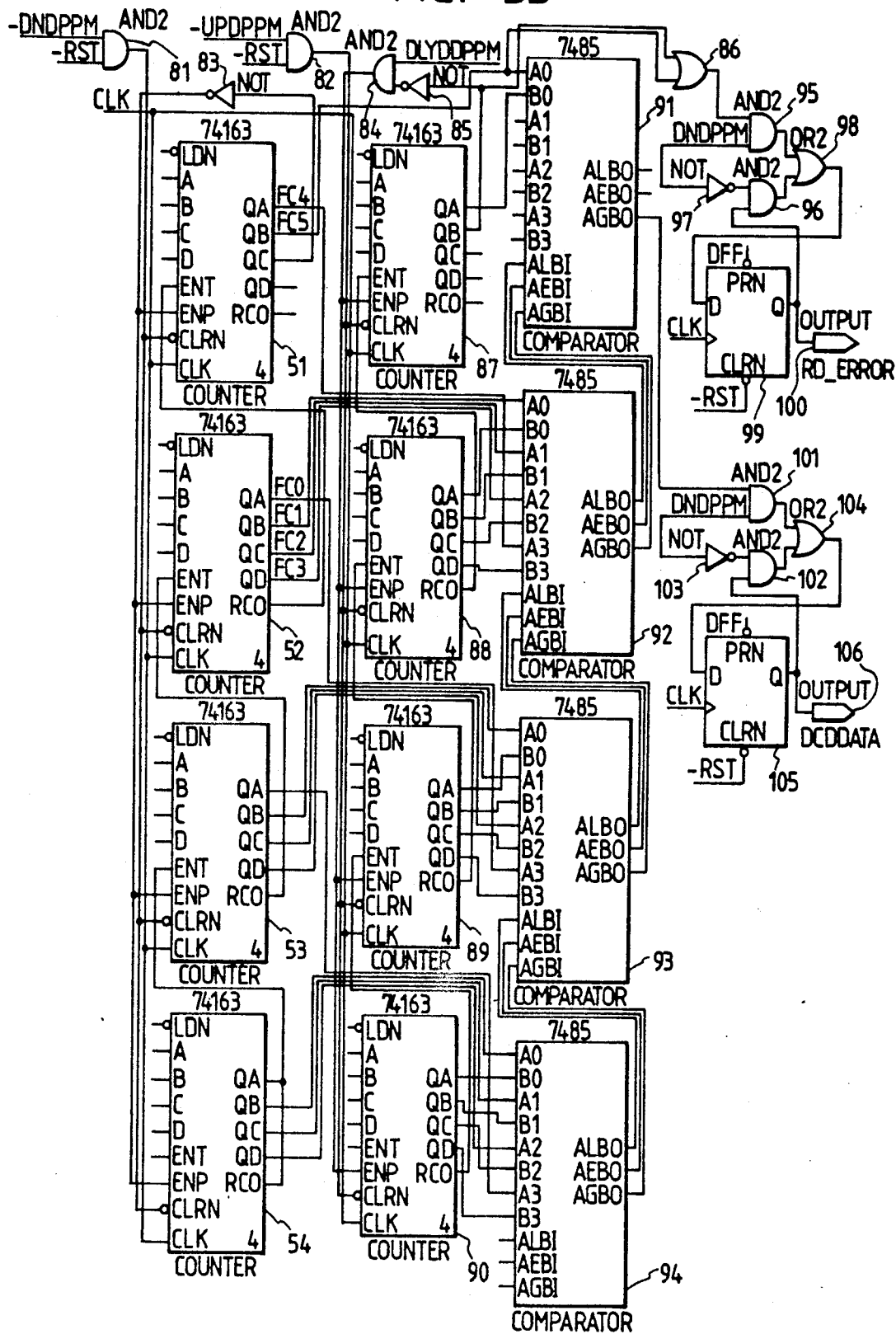
FIG. 33 is a circuit diagram showing the details of the logic circuit shown in FIG. 31.

FIGS. 32 to 34 show the details of the logic circuit 1029 shown in FIG. 31. The logic circuit 1029 includes input terminals 30, 31, 32, and 33, D-flip-flops 34, 35, 38, 39, 46, 66, 99, and 105, NOT gates 36, 40, 43, 47, 55, 60, 61, 62, 76, 78, 80, 83, 85, 97, and 103, NAND gates 37 and 48, AND gates 41, 42, 44, 63, 64, 77, 79, 81, 82, 84, 95, 96, 101, and 102, OR gates 45, 65, 86, 98, and 104, output terminals 49, 50, 67, 68, 69, 70, 71, 72, and 73, 4-bit counters (e.g., SN74163 available from TI Corp.) 51, 52, 53, 54, 58, 59, 87, 88, 89, and 90, 4-bit latches (e.g., SN74379 available from TI Corp.) 56 and 57, 4-bit comparators (e.g., SN7485 available from TI Corp.) 91, 92, 93, and 94, and output terminals 100 and 106.

In this embodiment, the cycle signal interval having a predetermined interval of a pulse position signal (PPM signal) shown in FIG. 20 is measured by a 14-bit counter constituted by the 4-bit counters 51, 52, 53, and 54 shown in FIG. 33, and a filter clock signal according to the cycle signal interval of the PPM signal is output. Thus, the switched capacitor filter 1012 is controlled by matching a frequency band with the PPM signal, and at the same time, the D/A converter 1028 and the multiplexer 1027 control, so that the PPM signal has a constant amplitude.

The detailed description will be made below with reference to the above figures.

In FIG. 31, the output signal from the magnetic head 1001 is amplified by the differential amplifier 1011, and is input to the switched capacitor filter 1012.

The switched capacitor filter 1012 receives a filter clock according to the cycle signal interval of the PPM signal from the logic circuit 1029.

The output from the switched capacitor filter 1012 is input to the multiplexer 1027. The other input of the multiplexer 1027 receives the output from the D/A converter 1028. The output from the D/A converter 1028 is controlled by a PPM clock latch signal from the logic circuit 1029, and the output amplitude of the multiplexer 1027 is controlled according to the cycle signal interval of the PPM signal, so that the amplitude of the PPM signal becomes constant.

The output from the multiplexer 1027 is input to the two voltage comparison circuits 1015 and 1016. When the PPM signal becomes lower than the voltage value from the reference voltage source 1013, the voltage comparison circuit 1015 outputs "1"; otherwise, it outputs "0". When the PPM signal becomes higher than the voltage value from the reference voltage source 1014, the voltage comparison circuit 1016 outputs "1", otherwise, it outputs "0".

The logic circuit 1029 receives the output from the voltage comparison circuit 1016 at an input terminal 1030, and the output from the voltage comparison circuit 1015 at an input terminal 1033. The logic circuit 1029 receives the output from the oscillation circuit 1018 at an input terminal 1031, and as is apparent from FIG. 20, the input signals are not simultaneously applied to the input terminals 1030 and 1033.

In FIG. 32, when the output from the voltage comparison circuit 1016 changes from "0" to "1", i.e., when data at the input terminal 30 changes from "0" to "1", a signal "1" is output to the output terminal 50 two system clocks later.

When data at the input terminal changes from "0" to "1", a signal "0" is output to the output terminal 50 two system clocks later. At the same time, a signal "0" is output to the output terminal 49 for one system clock. This signal is a −DNDPPM signal, which is output in response to each clock of the PPM signal. More specifically, DDPPM and −DNDPPM signals are formed in the same manner as in FIG. 17.

A signal "1" appears as an output UPDPPM of the AND gate 77 for one system clock when the PPM signal rises, i.e., when a data signal in the PPM signal is generated. At the same time, a signal "0" appears as an output −UPDPPM of the NOT gate 78.

In FIGS. 33 and 34, when the −DNDPPM signal goes to logic "0", the 14-bit counter constituted by the 4-bit counters 51, 52, 53, and 54 loads input data. In this case, input data is C000H in hexadecimal notation. If the oscillation frequency of the oscillation circuit 18 is 8 MHz, the carry output of the 4-bit counter 51 goes to logic "1" after an elapse of 2.048 ms from the beginning of the count-up operation.

A 6-bit latch constituted by the 4-bit latches 56 and 57 latches the upper 6 bits of the output from the 14-bit counter when the −DNDPPM signal goes to logic "0".

The upper 6 bits of the output from the 14-bit counter are output to the output terminals 68, 69, 70, 71, 72, and 73 at the cycle interval of the PPM signal. More specifically, this operation is equivalent to counting the clock interval of the PPM signal as 6-bit data.

The outputs from the output terminals 68, 69, 70, 71, 72, and 73 are output to the D/A converter 1028, and change the gain of the multiplexer 1027 according to the cycle interval of the PPM signal.

Every time a 6-bit counter constituted by the 4-bit counters 58 and 59 performs a count-up operation. and outputs a carry signal, it loads the negative output from the 6-bit latch. Thus, the output interval of the carry signal is changed according to the cycle interval of the PPM signal.

The D-flip-flop 66 inverts its output every time the carry signal from the 4-bit counter 58 goes to logic "1". The output from the D-flip-flop 66 is output to the switched capacitor filter 1012 as a filter clock.

In this embodiment, the cycle interval of the PPM signal/filter clock interval=128.

Since the relationship between these counters and latches is as shown in FIG. 19 described above, a detailed description thereof will be omitted.

The 4-bit counters 51 to 54 constitute the 14-bit counter, which is cleared by the −DNDPPM signal which goes to logic "0" in response to the trailing edge of the PPM signal (i.e., is generated in response to the clock signal of the PPM signal). Thereafter, the 14-bit counter performs a count-up operation. Therefore, the 14-bit counter counts the interval of the PPM signal.

The 4-bit counters 87 to 90 constitute a 13-bit counter cleared by a −UPDPPM signal which goes to logic "0" in response to the leading edge of the PPM signal (i.e., is generated in response to a data signal of the PPM signal). When the PPM signal is "0" (in this case, when DDPPM≈0), the 13-bit counter stops the count operation. Otherwise, i.e., when the PPM signal is "1" (in this case, when DDPPM=1), the 13-bit counter performs a count-up operation. Therefore, the 13-bit counter counts an interval between a data signal and a clock signal of the PPM signal.

The 4-bit comparators 91 to 94 compare the outputs from the above-mentioned counters. The output from the 14-bit counter is compared by omitting its least significant bit. Thus, the respective digit places of the output value of the 14-bit counter are shifted to the right by one digit place.

The 4-bit comparators 91 to 94 are connected in series with each other to constitute a 13-bit comparator. The output from the 13-bit comparator, i.e., an output AGBO from the 4-bit comparator 91 goes to logic "1" when an A input (the output from the 14-bit counter) is larger than a B input (the output from the 13-bit counter).

A latch circuit constituted by the AND gates 101 and 102, the NOT gate 103, the OR gate 104, and the D-flip-flop 105 latches the output from the 13-bit comparator when the PPM signal goes to "L" level (in this case, for one system clock corresponding to DNPPM=1), and outputs the latched data to the output terminal 106.

A latch circuit constituted by the AND gates 95 and 96, the NOT gate 97, the OR gate 98, and the D-flip-flop 99 generates an error signal when either the 14-bit counter or the 13-bit counter overflows.

FIG. 21 shows the relationship between the output voltage from the switched capacitor filter 1012 and the cycle interval of the PPM signal.

The amplitude of the signal output from the magnetic head 1001 is proportional to the film feed speed. A noise voltage is also proportional to the cycle interval since the filter clock of the switched capacitor filter 1012 is changed by the logic circuit 1029.

When the output level of the D/A converter 1028 is set to be constant when the output from the multiplexer 1027 is FFH and C0H, the output amplitude of the multiplexer 1027 becomes constant regardless of the cycle interval of the PPM signal, as shown in FIG. 22. Therefore, even when the reference voltages for the voltage comparison circuits are set to be constant, magnetic data information can be precisely reproduced regardless of the cycle interval of the PPM signal.

However, in the above embodiment, the counter circuit for counting the cycle interval of the PPM signal, the counter circuit for counting a clock-data time interval, and the comparison circuit for comparing these counter values must be arranged, and the circuit arrangement may be complicated.

Therefore, in the eighth embodiment to be described below, a carry signal from a counter circuit for counting the cycle interval of a PPM signal is used as an enable signal for an up/down counter circuit, thereby simplifying a circuit arrangement.

Figure 29:
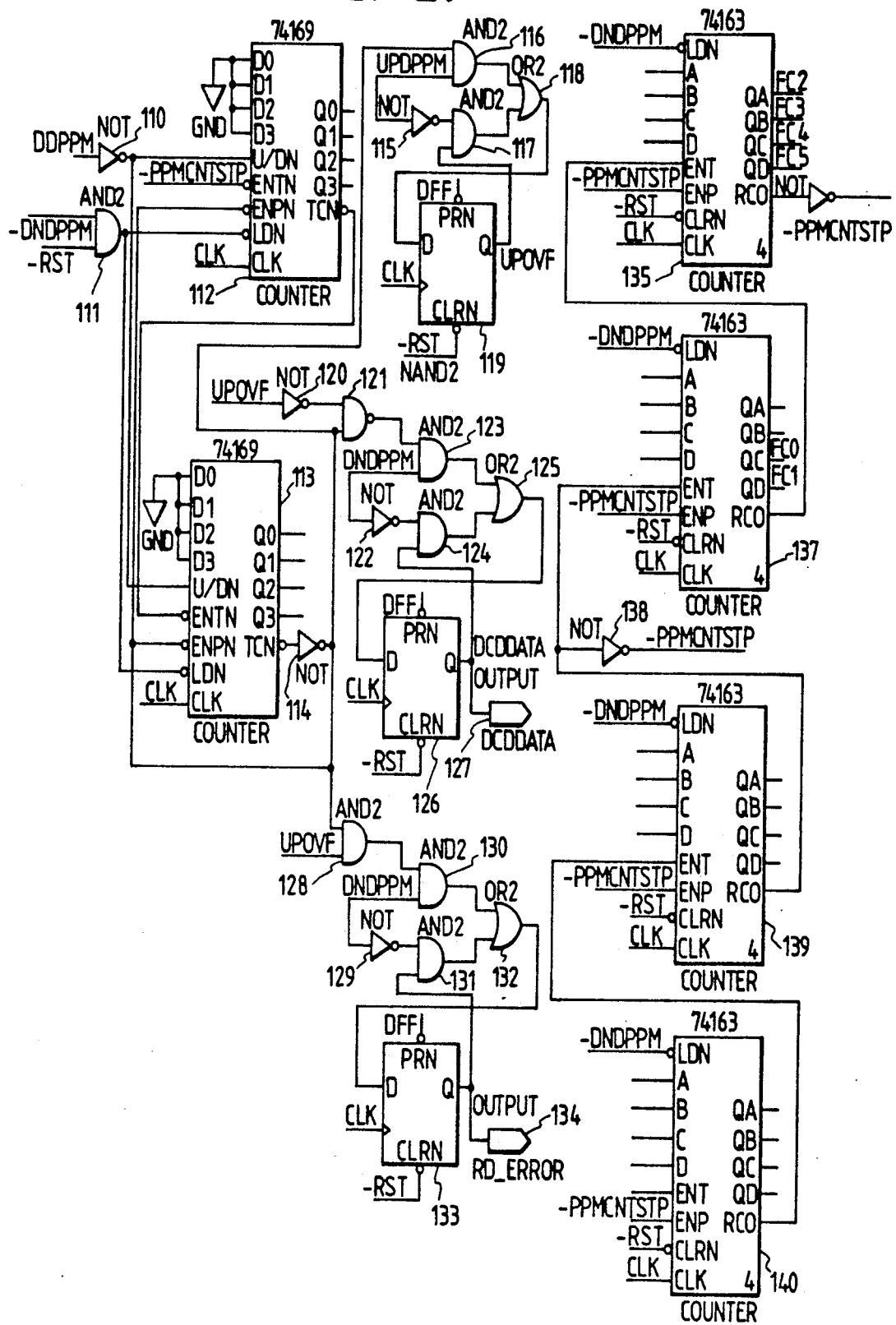
FIG. 29 is a circuit diagram showing a logic circuit according to the eighth embodiment of the present invention.

FIG. 29 is a circuit diagram for explaining the eighth embodiment of the present invention, and corresponds to FIG. 33 of the above embodiment.

The circuit shown in FIG. 29 includes NOT gates 110, 114, 115, 120, 122, 129, 136, and 138, AND gates 111, 116, 117, 123, 124, 128, 130, and 131, 4-bit up/down counters (e.g., SN74169 available from TI Corp.) 112 and 113, OR gates 118, 125, and 132, a NAND gate 121, D-flip-flips 119, 126, and 133, output terminals 127 and 134, and 4-bit counters (e.g., SN74163 available from TI Corp.) 135, 137, 139, and 140.

The 4-bit up/down counters 112 and 113 demodulate a PPM signal. A DDPPM signal is applied to the NOT gate 110, and when the DDPPM signal is "0", the 4-bit up/down counters 112 and 113 perform a count-up operation; when the DDPPM signal is "1", the 4-bit up/down counters 112 and 113 perform a count-down operation.

The 4-bit up/down counter 112 is enabled by a carry signal output from the 4-bit counter 139. If the system clock frequency is 8 MHz, the frequency of the carry signal output from the 4-bit counter 139 is 31.25 kHz. Therefore, the 4-bit up/down counter 113 outputs a carry signal when the interval of DDPPM="0" of the PPM signal continues for 8.192 ms. At this time, the output from the D-flip-flop 119, i.e., an UPOVF signal goes to logic "1". When the interval of the DDPPM signal="1" is equal to or shorter than 8.192 ms, a DCDDATA signal as a signal obtained by decoding and binary-converting the DDPPM signal goes to logic "1". When the interval of the DDPPM signal="1" is longer than 8.192 ms, the DCDDATA signal goes to logic "1". At the same time, an RD ERROR signal goes to logic "1", and informs a decoding error to a microcomputer 1003.

When the UPOVF signal does not go to logic "1", the 4-bit up/down counters 112 and 113 perform a count-up operation during a "0" interval of the DDPPM signal, and perform a count-down operation during a "1" interval of the DDPPM signal. As a result, upon detection of the carry signal from the 4-bit up/down counter 113, the DDPPM signal can be precisely decoded to the DCDDATA signal as a binary signal.

During this interval, the 4-bit counters 135, 137, 139, and 140 count the interval between adjacent trailing edges (clocks) of the DDPPM signal, and operate as in the prior art. In this embodiment, since the system clock frequency is set to be 8 MHz, a 16-bit counter arrangement is adopted in place of a 14-bit counter in other embodiments.

What is claimed is:

1. A camera having a data processing apparatus for determining data on the basis of an interval between trailing and leading edge positions of a continuous signal, comprising:

(a) a processing circuit having count means for counting a time interval between the trailing edge timing and the leading edge timing of the signal in a first direction, said count means generating a first signal when a count value of said count means reaches a predetermined count value within the time interval, said processing circuit having a first function of latching the first signal, and a second function of causing said count means to count a time interval between the leading edge timing and the trailing edge timing of the signal from the predetermined count value in a direction opposite to the first direction, and judging whether or not the count value of said count means reaches a predetermined second count value, and said processing circuit determining data on the basis of the latched first signal and a judgment result of the second function.

2. A camera according to claim 1, wherein the predetermined second count value is a value corresponding to a count value at the beginning of a count operation by the first function.

3. A camera according to claim 1, wherein said count means comprises an up/down counter.

4. A camera having a data processing apparatus for determining data on the basis of an interval between trailing and leading edge positions of a continuous signal, comprising:

(a) count means for counting a first time interval between the trailing edge timing and the leading edge timing of the signal, and a second time interval between the leading edge timing and the trailing edge timing of the signal; and (b) a processing circuit for detecting whether or not a count amount counted within the first time interval reaches a predetermined value and whether or not a count amount counted within the second time interval reaches a predetermined value, and determining data on the basis of detection results in the first and second time intervals.

5. A camera according to claim 4, wherein said counter means has addition and subtraction counter functions, and counts the first and second time intervals by switching the counter functions.

6. A camera according to claim 5, wherein when the count amount within the first time interval reaches the predetermined value, said count means outputs a first signal and holds a count value at that time, said count means starts a count operation in the second time interval from the held count value and generates a second signal when the count value of said count means reaches a value at the beginning of a count operation in the first time interval, and said processing circuit determines data on the basis of the first and second signals.

* * * * *